United States Patent
Hatakeyama et al.

(10) Patent No.: US 10,515,735 B2
(45) Date of Patent: Dec. 24, 2019

(54) CONDUCTIVE POLYMER COMPOSITE AND SUBSTRATE

(71) Applicant: SHIN-ETSU CHEMICAL CO., LTD., Tokyo (JP)

(72) Inventors: Jun Hatakeyama, Joetsu (JP); Takayuki Nagasawa, Joetsu (JP); Koji Hasegawa, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 12 days.

(21) Appl. No.: 15/877,891

(22) Filed: Jan. 23, 2018

(65) Prior Publication Data
US 2018/0240564 A1    Aug. 23, 2018

(30) Foreign Application Priority Data

Feb. 22, 2017    (JP) .................... 2017-31563

(51) Int. Cl.
| | | |
|---|---|---|
| *H01B 1/12* | (2006.01) | |
| *C08F 120/58* | (2006.01) | |
| *C08L 41/00* | (2006.01) | |
| *C08F 128/00* | (2006.01) | |
| *C08K 5/42* | (2006.01) | |

(52) U.S. Cl.
CPC .......... *H01B 1/125* (2013.01); *C08F 120/58* (2013.01); *C08F 128/00* (2013.01); *C08L 41/00* (2013.01); *C08K 5/42* (2013.01)

(58) Field of Classification Search
None
See application file for complete search history.

(56) References Cited

U.S. PATENT DOCUMENTS

| | | | | |
|---|---|---|---|---|
| 5,043,195 A * | 8/1991 | Skrivseth | ................ | H01L 23/60 206/524.6 |
| 5,609,983 A * | 3/1997 | Kawamura | .............. | G03F 7/022 430/191 |
| 5,962,546 A * | 10/1999 | Everaerts | ............... | C07C 311/48 522/148 |
| 6,319,428 B1 * | 11/2001 | Michot | ................ | B01J 31/0215 252/500 |
| 6,476,114 B2 * | 11/2002 | Goeman | .................... | C08J 5/18 524/462 |
| 8,057,708 B2 | 11/2011 | Hsu | | |
| 2004/0106708 A1 * | 6/2004 | Mizumoto | ............... | C08K 5/19 524/242 |
| 2008/0193773 A1 * | 8/2008 | Hsu | .......................... | C08L 65/00 428/421 |
| 2013/0015071 A1 * | 1/2013 | Willis | ........................ | C08F 8/36 204/631 |
| 2015/0337064 A1 * | 11/2015 | Yang | ................... | C08F 214/262 525/353 |

FOREIGN PATENT DOCUMENTS

| | | |
|---|---|---|
| JP | 2008-146913 A | 6/2008 |
| JP | 5264723 B2 | 8/2013 |

OTHER PUBLICATIONS

U.S. Appl. No. 15/877,771, filed Jan. 23, 2018 in the name of Jun Hatakeyama et al.
Apr. 4, 2019 U.S. Office Action issued U.S. Appl. No. 15/877,771.

* cited by examiner

*Primary Examiner* — Katie L. Hammer
(74) *Attorney, Agent, or Firm* — Oliff PLC

(57) ABSTRACT

An object of the present invention is to provide a conductive polymer composite which has good filterability and good film forming property by spin coating and, when a film is formed, can form a conductive film having high transparency and good flatness property. It is provided a conductive polymer composite comprising (A) a π-conjugated polymer, and (B) a dopant polymer containing a repeating unit "a" represented by the following general formula (1), and having a weight average molecular weight in the range of 1,000 to 500,000:

(1)

wherein, $R^1$, $Z_1$, $Rf_1$, and "a" are as defined in the specification.

20 Claims, No Drawings

CONDUCTIVE POLYMER COMPOSITE AND SUBSTRATE

TECHNICAL FIELD

The present invention relates to a conductive polymer composite and a substrate onto which a conductive film has been formed by the conductive polymer composite.

BACKGROUND ART

In a polymer having a conjugated double bond (a π-conjugated polymer), the polymer itself does not show conductivity, but conductivity is exhibited by doping an appropriate anion molecule and it becomes a conductive polymer material (a conductive polymer composition). A (hetero)aromatic polymer such as polyacetylene, polythiophene, polyselenophene, polytellurophene, polypyrrole, polyaniline, and a mixture thereof, and the like, has been used as then-conjugated polymer, and a sulfonic acid-based anion has most frequently been used as the anion molecule (a dopant). This is because the sulfonic acid which is a strong acid interacts with the π-conjugated polymer with good efficiency.

As the sulfonic acid-based anion dopant, sulfonic acid polymers such as polyvinylsulfonic acid and polystyrenesulfonic acid (PSS), have widely been used (Patent Document 1). In addition, in the sulfonic acid polymer, there is a sulfonated perfluoroalkyl vinyl ether represented by Nafion®, which has been used for fuel cell applications.

The polystyrenesulfonic acid (PSS) which is a sulfonic acid homopolymer has high efficiency in doping to the π-conjugated polymer since the sulfonic acid is continuously present in the monomer unit in the polymer main chain, and it can improve dispersibility of the π-conjugated polymer after doping in water. This is because hydrophilicity is retained by the presence of sulfo groups excessively present in the PSS and the dispersibility in water is dramatically improved.

The polythiophene using the PSS as a dopant can be handled as a highly conductive and aqueous dispersion, and thus, it is expected as a coating type conductive film material to be used in place of ITO (indium tin oxide). However, the PSS is a water-soluble resin, and hardly dissolved in an organic solvent. Accordingly, the polythiophene using the PSS as a dopant has also high hydrophilicity, but its affinity to an organic solvent or an organic substrate is low, and it is difficult to disperse in an organic solvent, and to form a film on an organic substrate.

In addition, when the polythiophene using the PSS as a dopant is used, for example, in a conductive film for organic EL lighting, hydrophilicity of the polythiophene using the PSS as a dopant is extremely high, so that a large amount of moisture likely remains in the conductive film, and the formed conductive film is likely to take in moisture from the external atmosphere. As a result, the luminescent material of the organic EL is chemically changed to lower its luminescent ability, and moisture condenses with a lapse of time which becomes a defect, whereby there is a problem that the lifetime of the whole organic EL device is shortened. Moreover, the polythiophene using the PSS as a dopant has a large particle size in the aqueous dispersion, so that there are problems that unevenness at the surface of the film after formation of the film is large, and a non-light emitting portion called dark spot is generated when it is applied to the organic EL lighting.

In addition, the polythiophene using the PSS as a dopant has absorption in the blue region around a wavelength of 500 nm, so that when the material is used by coating onto a transparent substrate such as a transparent electrode, and when the conductivity necessary for the device to function is supplemented with the solid content concentration and the film thickness, there is also a problem that the transmittance as a member is affected.

In Patent Document 2, it has been proposed a conductive polymer composition formed by a conductive polymer which contains a π-conjugated polymer formed by a repeating unit selected from thiophene, selenophene, tellorophene, pyrrole, aniline, and a polycyclic aromatic compound, and a fluorinated acid polymer which can be wetted by an organic solvent, and 50% or more of which is neutralized by a cation, and it has been shown that it becomes an aqueous dispersion of a conductive polymer by combining water, a precursor monomer of the π-conjugated polymer, a fluorinated acid polymer, and an oxidizing agent in an arbitrary order.

However, in such a conventional conductive polymer, particles are aggregated in a dispersion immediately after synthesis, and when an organic solvent which becomes a highly conductive agent as a coating material is added, aggregation is further promoted and filterability thereof is worsened. On the other hand, if spin coating is carried out without filtration, there are problems that a flat film cannot be obtained due to the influence of particle aggregates, resulting in causing coating failure.

In addition, the polythiophene using the PSS as a dopant can be also used as a hole injection layer. In this case, a hole injection layer is provided between a transparent electrode such as ITO, and a light emitting layer. Since conductivity is ensured by the lower transparent electrode, it is not necessary for the hole injection layer to have high conductivity. For the hole injection layer, it is required to generate no dark spot, or to have high hole transporting ability.

PRIOR ART DOCUMENTS

Patent Documents

Patent Document 1: Japanese Patent Application Publication No. 2008-146913
Patent Document 2: Japanese Patent No. 5264723

SUMMARY OF INVENTION

Technical Problem

The polythiophene-based conductive polymer using the PSS such as PEDOT-PSS having high versatility as a dopant has high conductivity but there are problems that its transparency is poor since it has absorption in visible light, and in the state of an aqueous dispersion, it is highly aggregated so that filtration and purification thereof are difficult, whereby there are problems that film formability by spin coating and surface roughness at the film formed portion are poor.

The present invention has been accomplished in view of the circumstance, and an object thereof is to provide a conductive polymer composite which is capable of forming a conductive film having good filterability and good film formability by spin coating, and high transparency and good flatness when a film is formed.

Solution to Problem

To solve the problems, in the present invention, it is provided a conductive polymer composite comprising (A) a π-conjugated polymer, and
(B) a dopant polymer containing a repeating unit "a" represented by the following general formula (1) and having a weight average molecular weight in the range of 1,000 to 500,000,

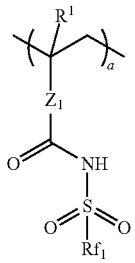

(1)

wherein, $R^1$ represents a hydrogen atom or a methyl group; $Rf_1$ represents a linear or branched alkyl group having 1 to 4 carbon atoms or a phenyl group, and has at least one of a fluorine atom or a trifluoromethyl group in $Rf_1$; $Z_1$ represents a single bond, an arylene group having 6 to 12 carbon atoms or —C(=O)—O—$R^2$—; $R^2$ represents a linear, branched or cyclic alkylene group having 1 to 12 carbon atoms, an arylene group having 6 to 10 carbon atoms or an alkenylene group having 2 to 10 carbon atoms, and may have an ether group, a carbonyl group or an ester group in $R^2$; and "a" is $0<a\leq1.0$.

When such a conductive polymer composite is employed, a conductive film which has good filterability, good spin coat film formation property on an inorganic or organic substrate, high transparency and good flatness when a film is formed can be formed.

Also, at this time, the repeating unit "a" in the Component (B) preferably contains one or more kinds of repeating units selected from the repeating units "$a_1$" to "$a_4$" represented by the following general formula (1-1),

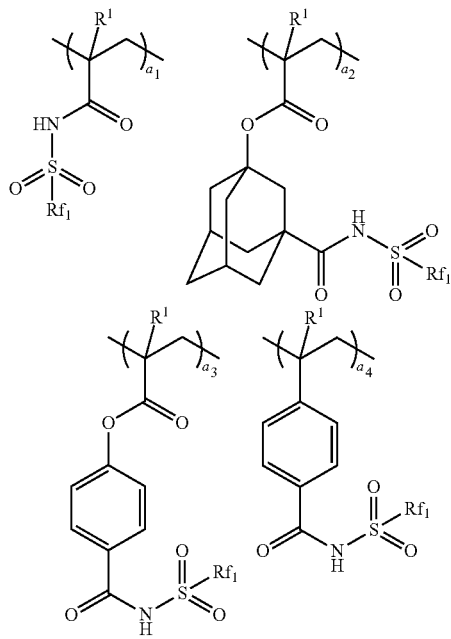

(1-1)

wherein, $R^1$ and $Rf_1$ have the same meanings as defined above; and "$a_1$", "$a_2$", "$a_3$", and "$a_4$" are $0\leq a_1\leq1.0$, $0\leq a_2\leq1.0$, $0\leq a_3\leq1.0$, $0\leq a_4\leq1.0$, and $0<a_1+a_2+a_3+a_4\leq1.0$.

Thus, Component (B) is preferably the material as mentioned above, then, filterability and film formability of the material, and affinity to an organic solvent and an organic substrate are improved, and transmittance after forming the film is improved.

At this time, the Component (B) preferably further contains a repeating unit "b" represented by the following general formula (2).

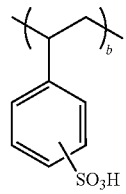

(2)

wherein, "b" is $0<b<1.0$.

By containing such a repeating unit "b", conductivity can be further improved.

Moreover, at this time, the Component (B) is preferably a block copolymer.

When Component (B) is a block copolymer, conductivity can be further improved.

Moreover, at this time, Component (A) is preferably a material in which one or more precursor monomers selected from the group consisting of pyrrole, thiophene, selenophene, tellorophene, aniline, a polycyclic aromatic compound, and a derivative thereof is/are polymerized.

When such a monomer(s) is/are employed, polymerization is easy, and stability in the air is good so that Component (A) can be easily synthesized.

Moreover, at this time, the conductive polymer composite is preferably a material which can be dispersed in water or an organic solvent.

In addition, the present invention is to provide a substrate onto which a conductive film is formed by the conductive polymer composite.

Thus, the conductive polymer composite of the present invention can be made a conductive film by coating it onto a substrate, to form a film.

Further, the conductive film thus formed is excellent in conductivity and transparency, so that it can be made a material which acts as a transparent electrode layer.

Advantageous Effects of Invention

When the conductive polymer composite of the present invention is employed, the dopant polymer of Component (B) containing a sulfonamide group as a strong acid forms a complex with the π-conjugated polymer of Component (A), which enables to form a conductive film that has low viscosity and good filterability, and good film formability by spin coating, and when a film is formed, because stability to light or heat is improved, has high durability, and has good transparency, flatness, and conductivity. Also, when such a conductive polymer composite is employed, affinity to an organic solvent or an organic substrate is good, and film formability becomes good both to an organic substrate and an inorganic substrate.

Further, the conductive film formed by such a conductive polymer composite is excellent in conductivity, transparency, so that it can be made a material which acts as a transparent electrode layer.

DESCRIPTION OF EMBODIMENTS

It has been desired to develop a material for forming a conductive film, which has good filterability and good film formability by spin coating, and when a film is formed, which can form a conductive film having high transparency and good flatness.

The present inventors have intensively studied to solve the problems, and as a result, they have found that by using a dopant polymer containing a repeating unit having a sulfone group to which a fluorinated alkyl group or phenyl group is bonded at one side and having a sulfonamide group with the structure having a carbonyl group at the other side in place of a polystyrenesulfonic acid (PSS) which has widely been used as a dopant for a conductive polymer material, the dopant polymer which is a super strong acid interacts strongly with the π-conjugated polymer, whereby transparency is improved by shifting the visible light absorption range of the π-conjugated polymer, and stability to light or heat is improved by strongly ion bonding the π-conjugated polymer and the dopant polymer. In addition, they have found that filterability becomes good so that film formability by spin coating is improved, and flatness at the time of forming a film becomes also good, whereby accomplished the present invention.

That is, the present invention is a conductive polymer composite comprising (A) a π-conjugated polymer, and (B) a dopant polymer containing a repeating unit "a" represented by the following general formula (1) and having a weight average molecular weight in the range of 1,000 to 500,000,

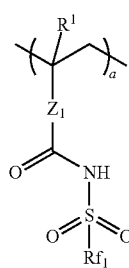
(1)

wherein, $R^1$ represents a hydrogen atom or a methyl group; $Rf_1$ represents a linear or branched alkyl group having 1 to 4 carbon atoms or a phenyl group, and has at least one of a fluorine atom or a trifluoromethyl group in $Rf_1$; $Z_1$ represents a single bond, an arylene group having 6 to 12 carbon atoms or —C(=O)—O—$R^2$—; $R^2$ represents a linear, branched or cyclic alkylene group having 1 to 12 carbon atoms, an arylene group having 6 to 10 carbon atoms or an alkenylene group having 2 to 10 carbon atoms, and may have an ether group, a carbonyl group or an ester group in $R^2$; and "a" is $0 < a \leq 1.0$.

In the following, the present invention is explained in detail, but the present invention is not limited by these.

In the present invention, "conductivity" means "electroconductivity".

In addition, in the present invention, "a", "$a_1$" to "$a_4$", "b", and "c" each represent a ratio of the repeating units in the molecule.

[(A) π-Conjugated Polymer]

The conductive polymer composite of the present invention contains a π-conjugated polymer as Component (A) The Component (A) may be a material in which a precursor monomer (an organic monomer molecule) which forms a π-conjugated chain (a structure in which a single bond and a double bond are alternately continued) is polymerized.

Such a precursor monomer may be shown, for example, monocyclic aromatics such as pyrroles, thiophenes, thiophene vinylenes, selenophenes, tellorophenes, phenylenes, phenylene vinylenes, and anilines; polycyclic aromatics such as acenes; acetylenes, and the like, and a homopolymer or a copolymer of these monomers may be used as Component (A).

Among the monomers, pyrrole, thiophene, selenophene, tellorophene, aniline, a polycyclic aromatic compound, and a derivative thereof are preferable in the points of easiness in polymerization and stability in the air, and pyrrole, thiophene, aniline, and a derivative thereof are particularly preferable, but the invention is not limited by these.

When the conductive polymer composite of the present invention contains the polythiophene as Component (A) in particular, it has characteristics of high conductivity and high transparency in visible light, so that it can be considered to develop to the uses of a touch panel, an organic EL display, and an organic EL lighting. On the other hand, when the conductive polymer composite of the present invention contains the polyaniline as Component (A), its absorption in visible light is large and its conductivity is low as compared with the case where it contains the polythiophene, so it is difficult to apply it in display applications, but it is easy to spin coating due to low viscosity, so that the use for top coating to prevent from charging by electrons of the resist upper layer in EB lithography can be considered.

In addition, Component (A) can give sufficient conductivity even when the monomer constituting then-conjugated polymer is not substituted, but for more heightening the conductivity, a monomer substituted by an alkyl group, a carboxyl group, a sulfo group, an alkoxy group, a hydroxyl group, a cyano group, or a halogen atom, may be used.

Specific examples of the monomers of pyrroles, thiophenes, and anilines, there may be shown pyrrole, N-methylpyrrole, 3-methylpyrrole, 3-ethylpyrrole, 3-n-propylpyrrole, 3-butylpyrrole, 3-octylpyrrole, 3-decylpyrrole, 3-dodecylpyrrole, 3,4-dimethylpyrrole, 3,4-dibutylpyrrole, 3-carboxypyrrole, 3-methyl-4-carboxypyrrole, 3-methyl-4-carboxyethylpyrrole, 3-methyl-4-carboxybutylpyrrole, 3-hydroxypyrrole, 3-methoxypyrrole, 3-ethoxypyrrole, 3-butoxypyrrole, 3-hexyloxypyrrole, 3-methyl-4-hexyloxypyrrole; thiophene, 3-methylthiophene, 3-ethylthiophene, 3-propylthiophene, 3-butylthiophene, 3-hexylthiophene, 3-heptylthiophene, 3-octylthiophene, 3-decylthiophene, 3-dodecylthiophene, 3-octadecylthiophene, 3-bromothiophene, 3-chlorothiophene, 3-iodothiophene, 3-cyanothiophene, 3-phenylthiophene, 3,4-dimethylthiophene, 3,4-dibutylthiophene, 3-hydroxythiophene, 3-methoxythiophene, 3-ethoxythiophene, 3-butoxythiophene, 3-hexyloxythiophene, 3-heptyloxythiophene, 3-octyloxythiophene, 3-decyloxythiophene, 3-dodecyloxythiophene, 3-octadecyloxythiophene, 3,4-dihydroxythiophene, 3,4-dimethoxythiophene, 3,4-diethoxythiophene, 3,4-dipropoxythiophene, 3,4-dibutoxythiophene, 3,4-dihexyloxythiophene, 3,4-diheptyloxythiophene, 3,4-dioctyloxythiophene, 3,4-didecyloxythiophene, 3,4- didodecyloxythiophene, 3,4-ethylenedioxythiophene, 3,4-ethylenedithiothiophene, 3,4-propylenedioxythiophene, 3,4-butenedioxythiophene, 3-methyl-4-methoxythiophene, 3-methyl-4-ethoxythiophene, 3-carboxythiophene, 3-methyl-4-carboxythiophene, 3-methyl-4-carboxymethyl-thiophene, 3-methyl-4-carboxyethylthiophene, 3-methyl-4-carboxybutylthiophene, 3,4-(2,2-dimethyl-propylenedioxy) thiophene, 3,4-(2,2-diethylpropylenedioxy)-thiophene, (2,3-dihydrothieno[3,4-b][1,4]dioxin-2-yl)-methanol; aniline, 2-methylaniline, 3-methylaniline, 2-ethylaniline, 3-ethylaniline, 2-propylaniline, 3-propylaniline, 2-butylaniline, 3-butylaniline, 2-isobutylaniline, 3-isobutylaniline, 2-methoxyaniline, 2-ethoxyaniline, 2-anilinesulfonic acid, and 3-anilinesulfonic acid.

Among these, a (co)polymer comprising one or two kinds selected from pyrrole, thiophene, N-methylpyrrole, 3-methylthiophene, 3-methoxythiophene, and 3,4-ethylenedioxythiophene is suitably used in the points of a resistance value and reactivity. Moreover, a homopolymers comprising pyrrole, or 3,4-ethylenedioxythiophene is more preferable since the conductivity is high.

It is to be noted that, from the practical reason, a number repeating of these repeating units (the precursor monomer) in Component (A) is preferably in the range of 2 to 20, and more preferably in the range of 6 to 15.

In addition, the molecular weight of Component (A) is preferably 130 to 5,000 or so.

[(B) Dopant Polymer]

The conductive polymer composite of the present invention contains a dopant polymer as Component (B). The dopant polymer of Component (B) contains the repeating unit "a" represented by the following general formula (1). That is, the dopant polymer of Component (B) is a strongly acidic polymer having a sulfone group to which a fluorinated alkyl group or phenyl group is bonded at one side, and having a sulfonamide group with the structure having a carbonyl group at the other side,

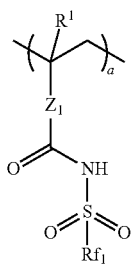

(1)

wherein, $R^1$ represents a hydrogen atom or a methyl group; $Rf_1$ represents a linear or branched alkyl group having 1 to 4 carbon atoms or a phenyl group, and has at least one of a fluorine atom or a trifluoromethyl group in $Rf_1$; $Z_1$ represents a single bond, an arylene group having 6 to 12 carbon atoms or —C(=O)—O—$R^2$—; $R^2$ represents a linear, branched or cyclic alkylene group having 1 to 12 carbon atoms, an arylene group having 6 to 10 carbon atoms or an alkenylene group having 2 to 10 carbon atoms, and may have an ether group, a carbonyl group or an ester group in $R^2$; and "a" is 0<a≤1.0.

In the general formula (1), $R^1$ represents a hydrogen atom or a methyl group.

$Rf_1$ represents a linear or branched alkyl group having 1 to 4 carbon atoms or a phenyl group, and has at least one of a fluorine atom or a trifluoromethyl group in $Rf_1$.

$Z_1$ represents a single bond, an arylene group having 6 to 12 carbon atoms or —C(=O)—O—$R^2$—, $R^2$ represents a linear, branched or cyclic alkylene group having 1 to 12 carbon atoms, an arylene group having 6 to 10 carbon atoms or an alkenylene group having 2 to 10 carbon atoms, and may have an ether group, a carbonyl group or an ester group in $R^2$. $R^2$ is preferably a methylene group, an ethylene group, a propylene group, an adamantylene group, or a phenylene group.

"a" is 0<a≤1.0.

Further, at this time, the repeating unit "a" in Component (B) preferably contains one or more kinds selected from the repeating units "$a_1$" to "$a_4$" represented by the following general formula (1-1),

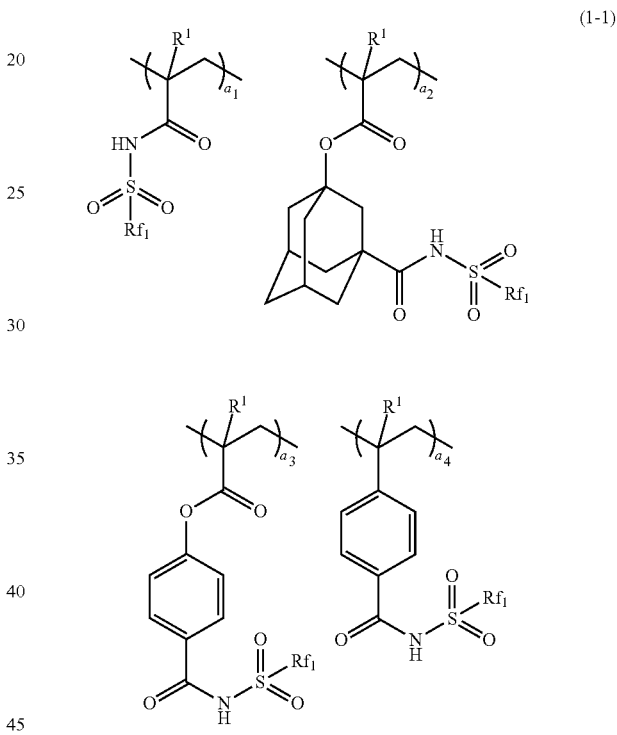

(1-1)

wherein, $R^1$ and $Rf_1$ have the same meanings as defined above; and "$a_1$", "$a_2$", "$a_3$", and "$a_4$" are 0≤$a_1$≤1.0, 0≤$a_2$≤1.0, 0≤$a_3$≤1.0, 0≤$a_4$≤1.0, and 0<$a_1$+$a_2$+$a_3$+$a_4$≤1.0.

A method for obtaining a dopant polymer for the conductive polymer containing the repeating unit "a" represented by the general formula (1) may be shown a method in which a polymerization reaction is carried out by using a monomer having a structure of a salt comprising a sulfonamide group and lithium, sodium, potassium, or a nitrogen compound, and after the polymerization, the structure of the salt comprising the sulfonamide group and lithium, sodium, potassium, or a nitrogen compound are changed to a sulfonamide group by ion-exchange.

Here, the polymer obtained by subjecting to the polymerization reaction using the monomer having the structure of the salt comprising the sulfonamide group and lithium, sodium, potassium, or a nitrogen compound preferably contains the repeating unit represented by the following general formula (3):

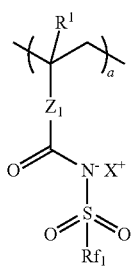

(3)

wherein, $R^1$, $Z_1$, $Rf_1$, and "a" have the same meanings as defined above, X represents lithium, sodium, potassium, or a nitrogen compound represented by the following general formula (4),

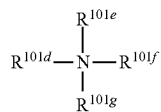

(4)

wherein, $R^{101d}$, $R^{101e}$, $R^{101f}$, and $R^{101g}$ each represent a hydrogen atom, or a linear, branched or cyclic alkyl group, alkenyl group, oxoalkyl group or oxoalkenyl group each having 1 to 12 carbon atoms, an aryl group having 6 to 20 carbon atoms, or an aralkyl group or an aryloxoalkyl group each having 7 to 12 carbon atoms, and a part or whole of the hydrogen atoms of these groups may be substituted by an alkoxy group; $R^{101d}$ and $R^{101e}$, or $R^{101d}$, $R^{101e}$ and $R^{101f}$ may form a ring, and when a ring is formed, $R^{101d}$ and $R^{101e}$, or $R^{101d}$, $R^{101e}$ and $R^{101f}$ represent an alkylene group having 3 to 10 carbon atoms or a heteroaromatic ring having a nitrogen atom in the formula in the ring.

Such a repeating unit is introduced, it is preferable since it is easily changed to the repeating unit "a" represented by the general formula (1) by ion-exchange.

The monomer having the structure of the salt comprising the sulfonamide group and lithium, sodium, potassium, or a nitrogen compound to be used for the manufacture of the dopant polymer, and for obtaining the repeating unit "a" represented by the general formula (1) for obtaining the conductive polymer composite of the present invention may be specifically exemplified by the following.

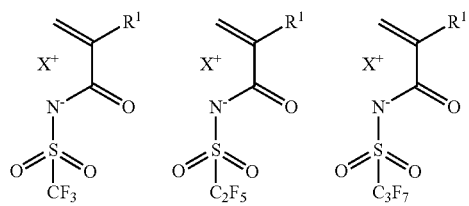

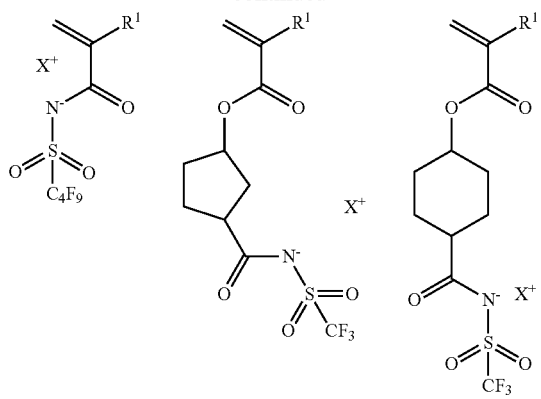

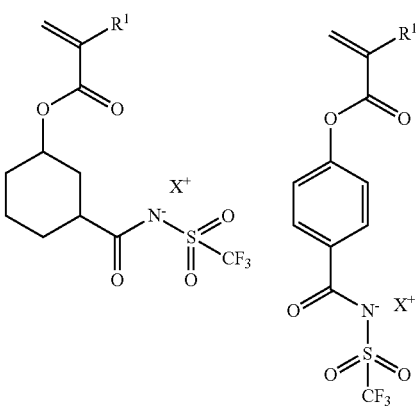

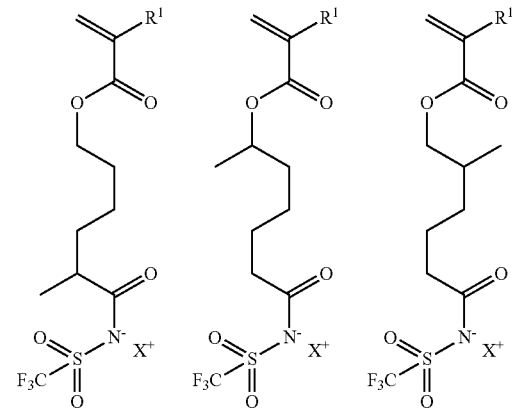

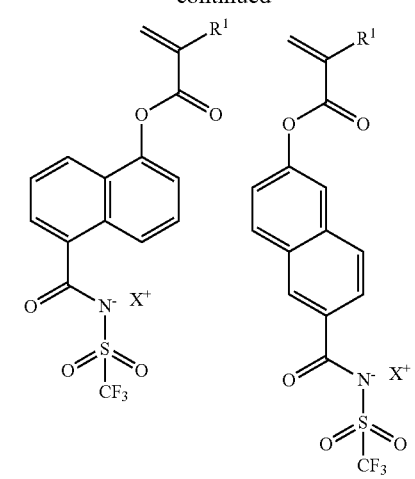
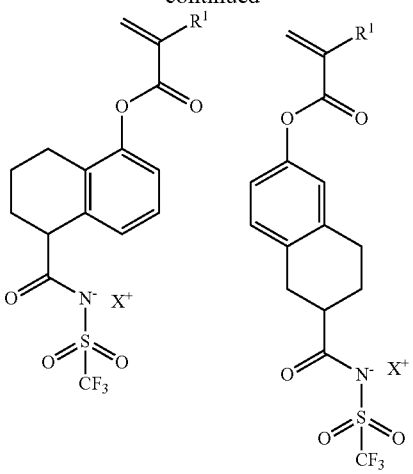
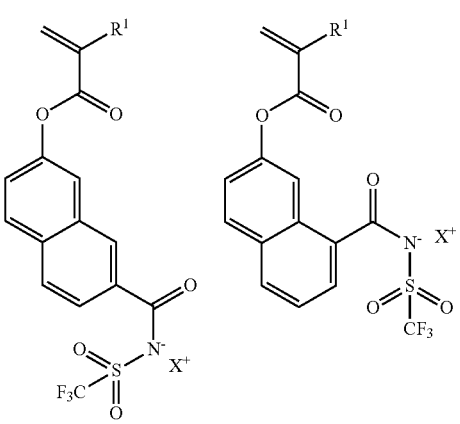
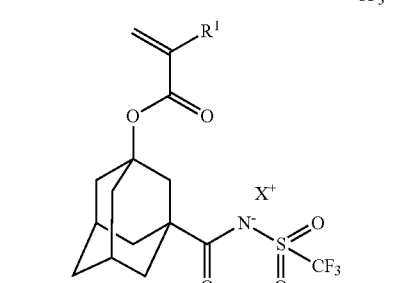
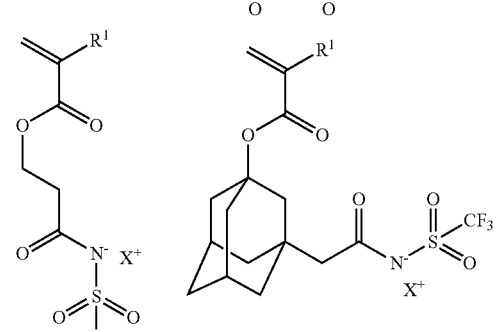
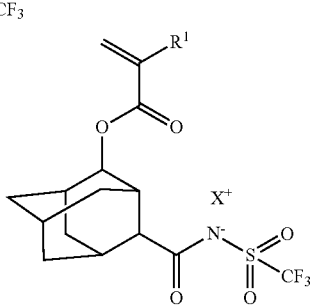
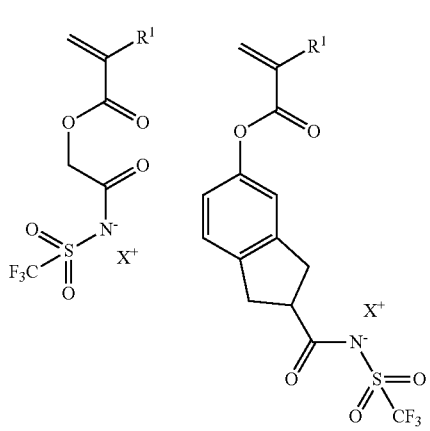
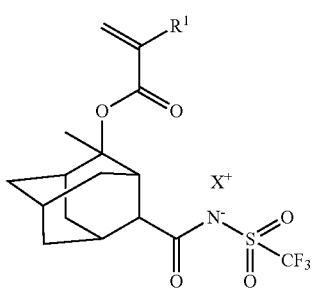

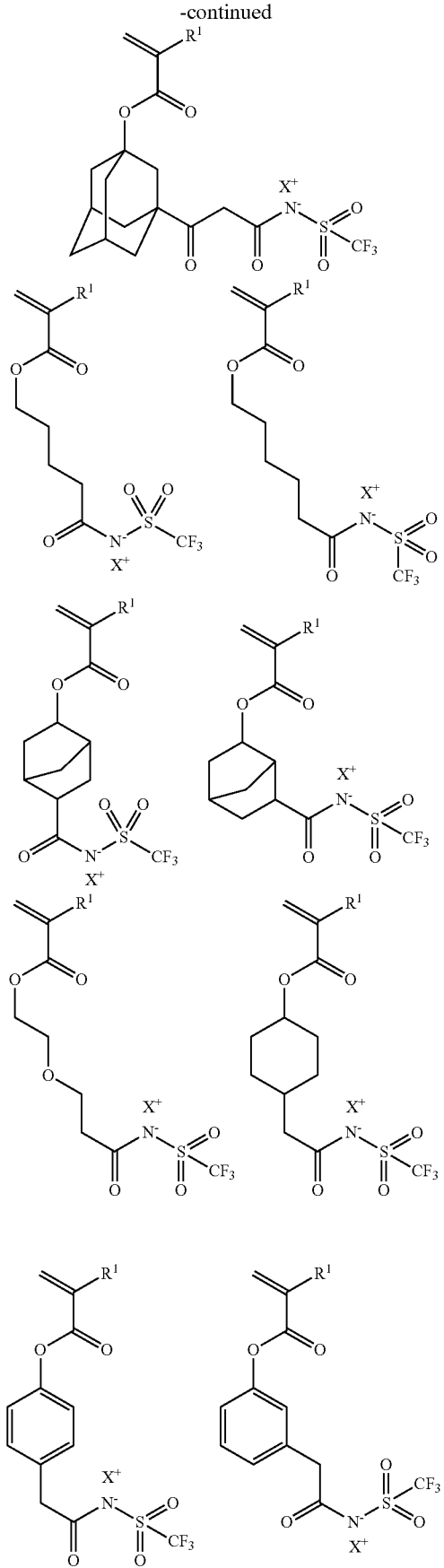

-continued

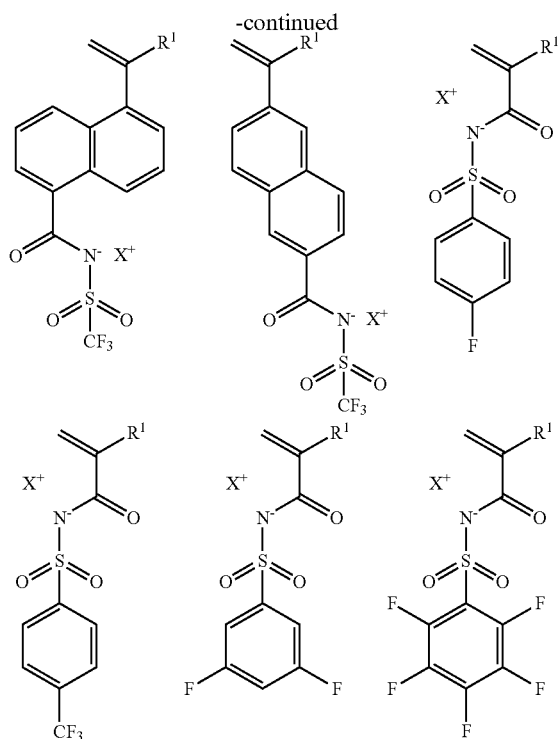

wherein, R¹ has the same meaning as defined above, and X represents lithium, sodium, potassium, or a nitrogen compound.

In addition, the repeating unit "a" represented by the general formula (1) is preferably a material containing one or more kinds selected from the repeating units "$a_1$" to "$a_4$" represented by the following general formula (1-1),

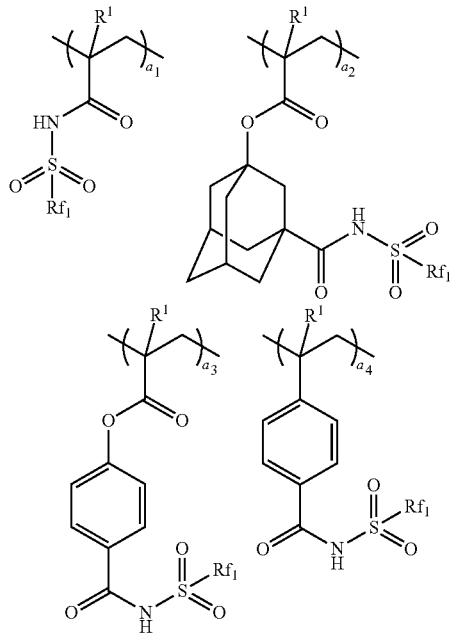

wherein, R¹ and $Rf_1$ have the same meanings as defined above; and "$a_1$", "$a_2$", "$a_3$", and "$a_4$" are $0 \leq a_1 \leq 1.0$, $0 \leq a_2 \leq 1.0$, $0 \leq a_3 \leq 1.0$, $0 \leq a_4 \leq 1.0$, and $0 < a_1+a_2+a_3+a_4 \leq 1.0$.

Such Component (B) is employed, filterability and film formability, and affinity to an organic solvent and an organic substrate of the material are improved, and transmittance after forming the film is improved.

Component (B) preferably further contains a repeating unit "b" represented by the following general formula (2). By containing such a repeating unit "b", conductivity can be further improved,

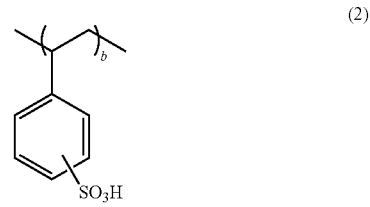

wherein, "b" is 0<b<1.0.

A monomer providing the repeating unit "b" may be specifically exemplified by the following compounds:

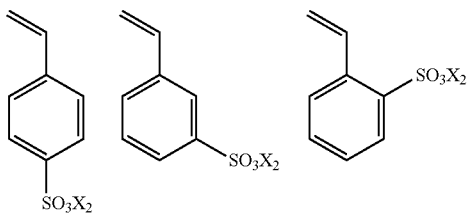

wherein, $X_2$ represents a hydrogen atom, lithium, sodium, potassium, a nitrogen compound or a sulfonium compound.

When the X and $X_2$ are nitrogen compounds, (P1a-3) described at the paragraph [0048] of JP 2013-228447 can be mentioned as an example.

Here, "a" is 0<a≤1.0, and preferably 0.2≤a≤1.0. If "a" is 0<a≤1.0 (That is, it contains the repeating unit "a"), the effects of the present invention can be obtained, and if "a" is 0.2≤a≤1.0, better effects can be obtained. In addition, when it contains the repeating unit "b", from the viewpoint of improvement in conductivity, "b" is preferably 0.2≤b<1.0, and more preferably 0.3≤b≤0.8.

Further, a ratio of the repeating unit "a" and the repeating unit "b" is preferably 0.2≤a≤0.8 and 0.2≤b≤0.8, and more preferably 0.3≤a≤0.6 and 0.4≤b≤0.7.

Further, the dopant polymer of Component (B) may contain a repeating unit "c" other than the repeating unit "a", and the repeating unit "b", and a monomer providing the repeating unit "c" may be shown, for example, a (meth)-acrylic-based, styrene-based, vinylnaphthalene-based, vinylsilane-based, acenaphthylene, indene, and vinylcarbazole, as well as a monomer having a silicon atom(s) or a fluorine atom(s).

The monomer providing the repeating unit "c" may be specifically exemplified by the following:

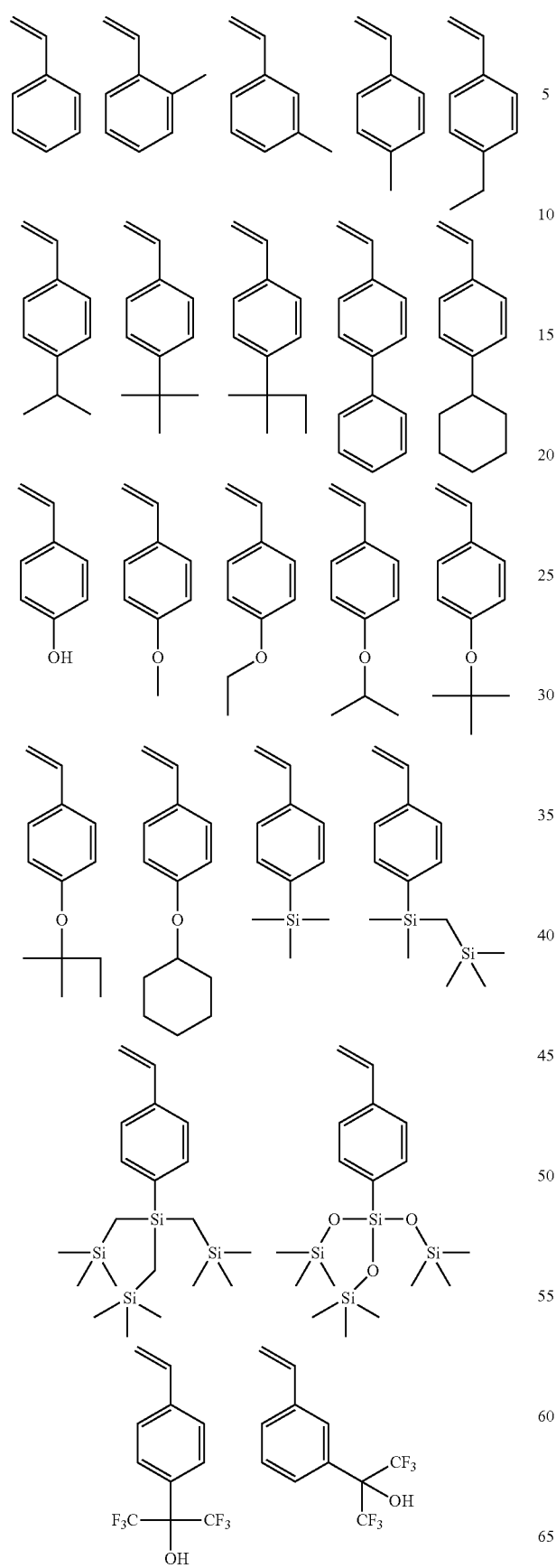
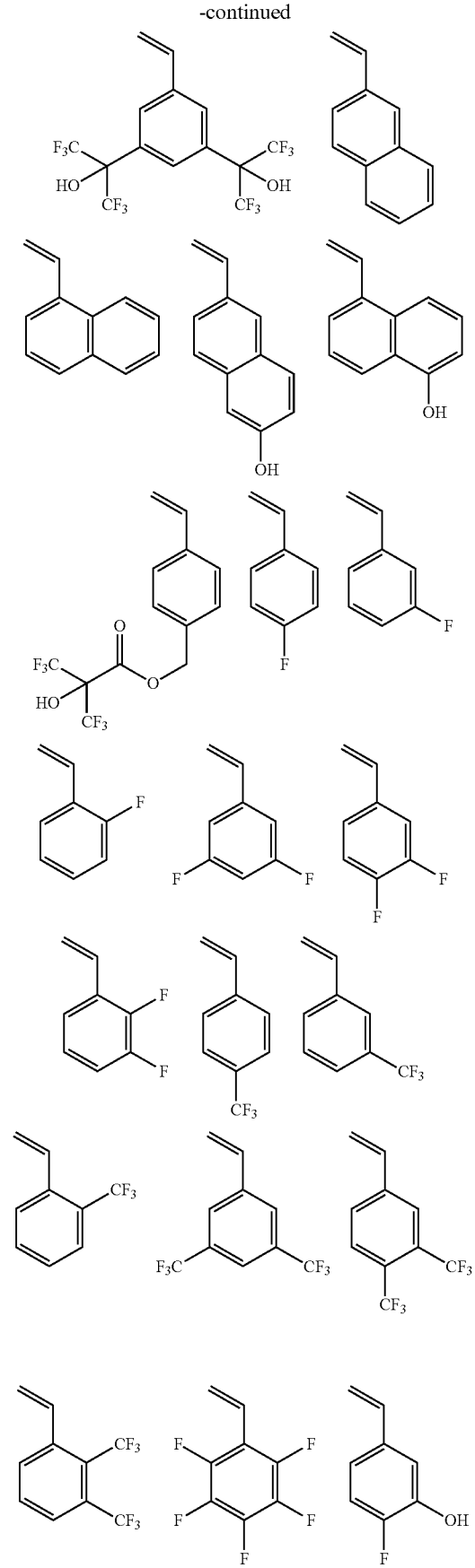

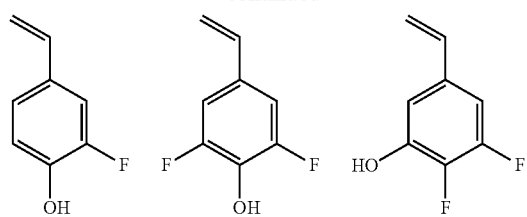
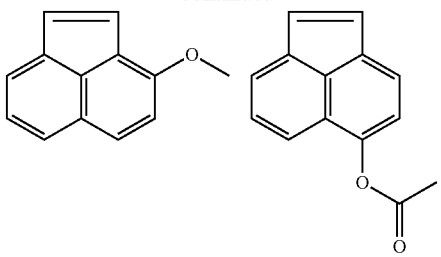
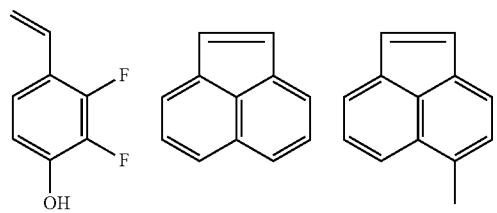
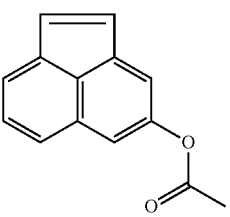
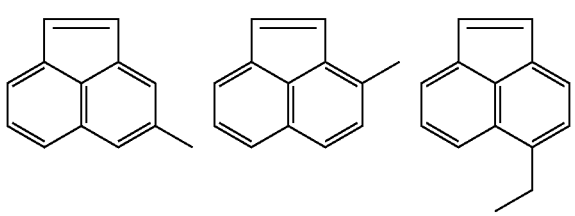
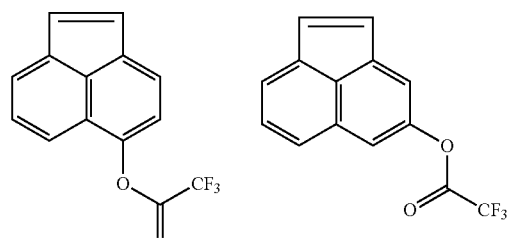
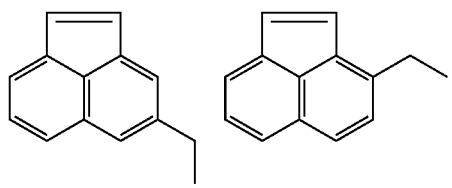
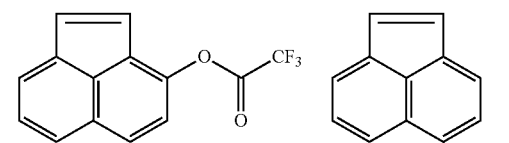
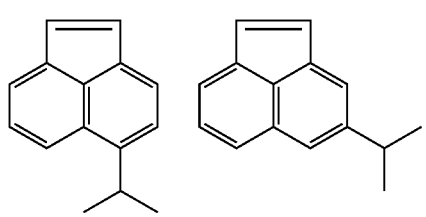
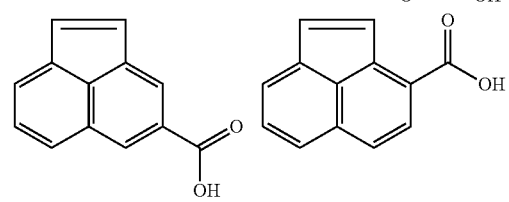
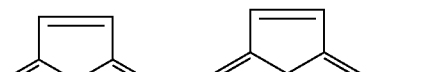
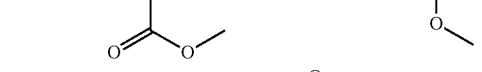
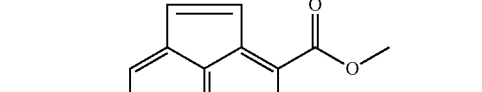
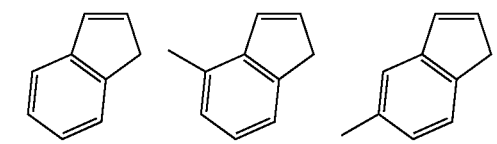

-continued

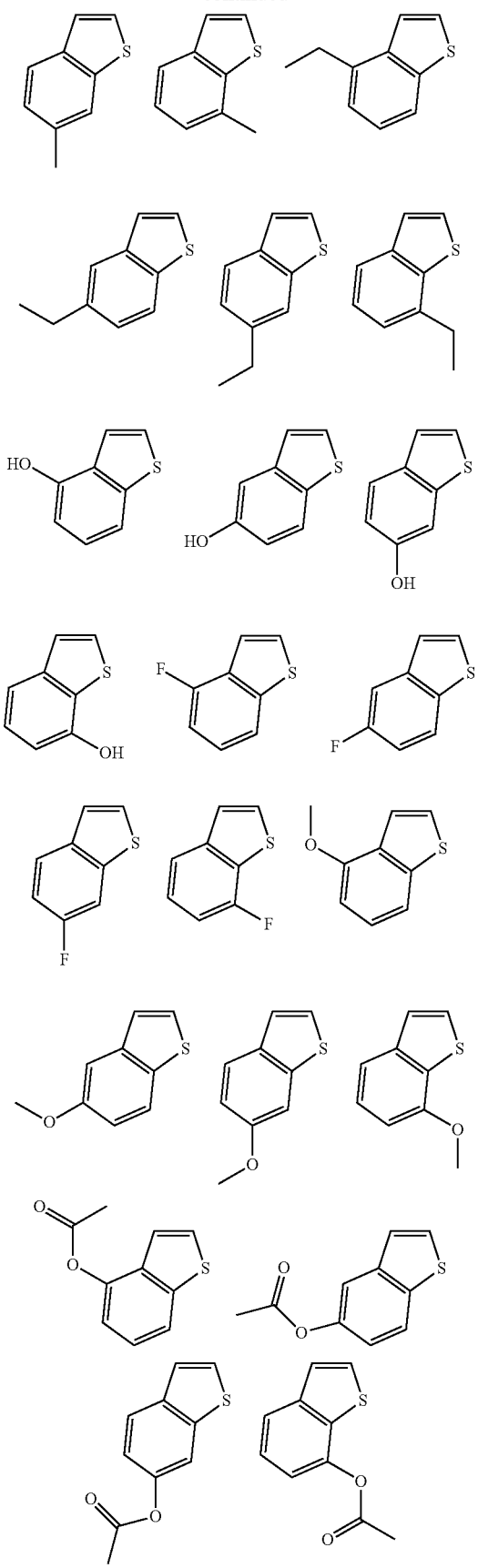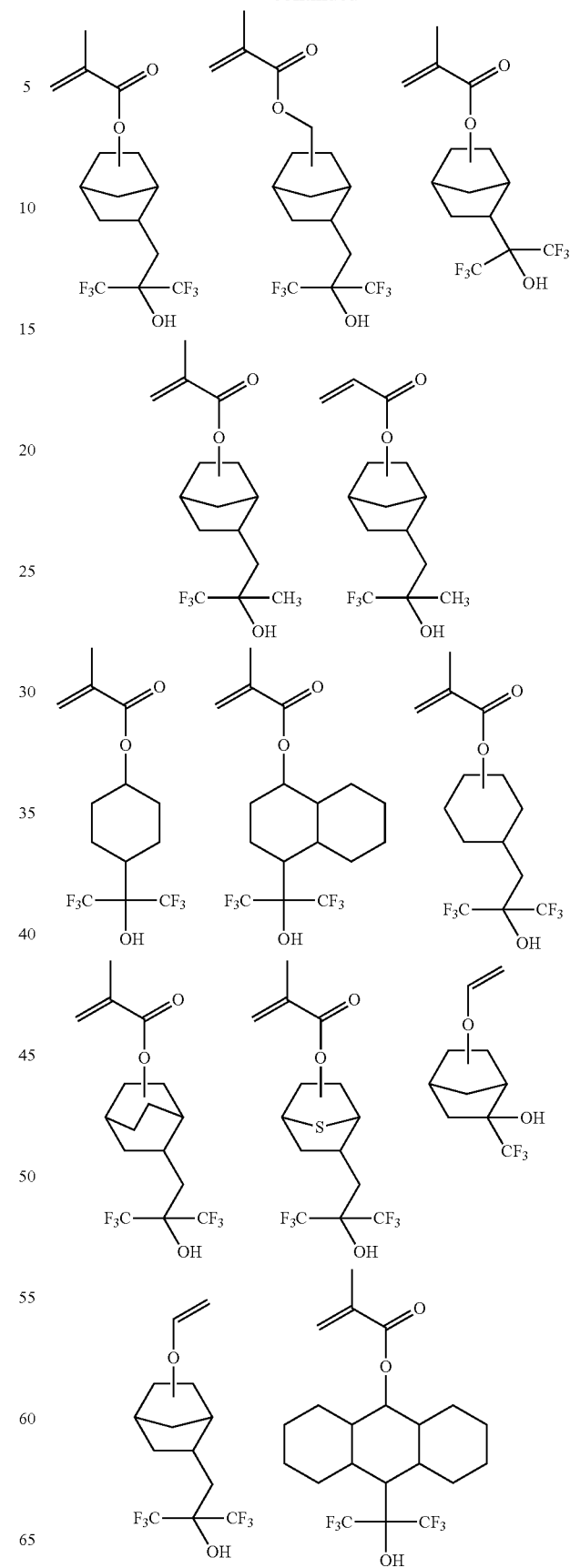

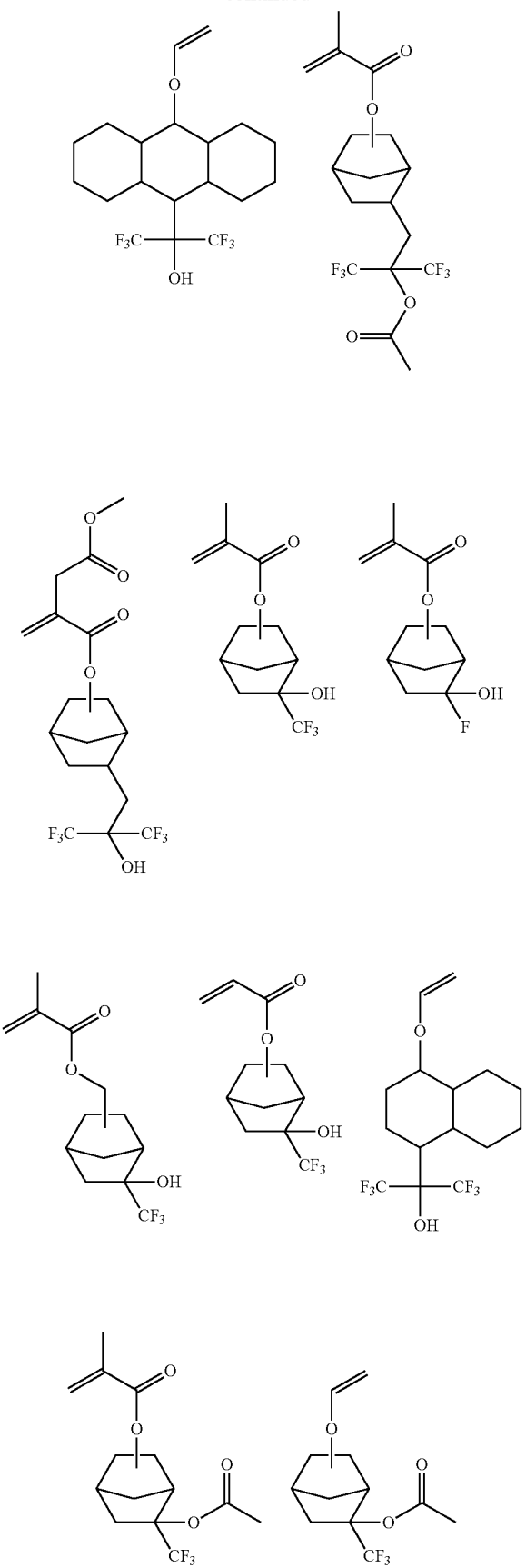
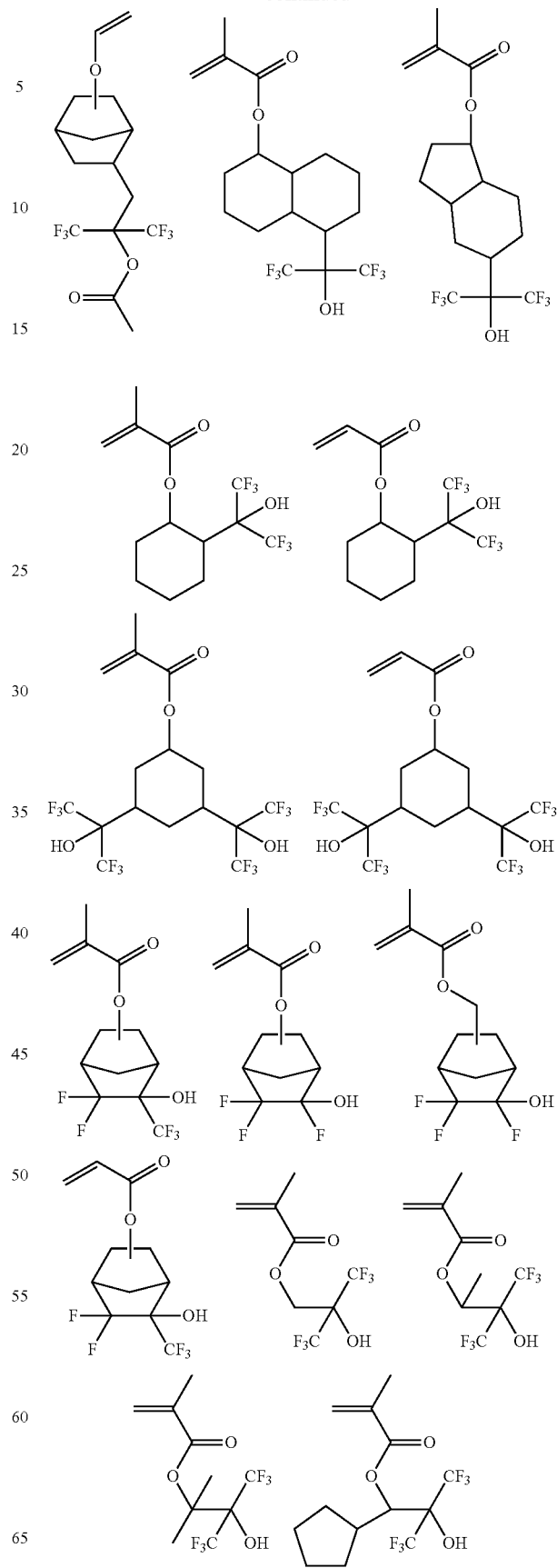

-continued
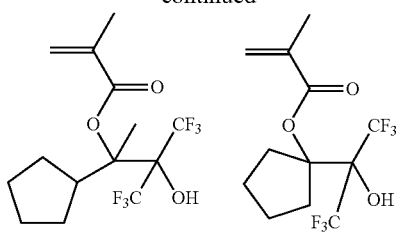
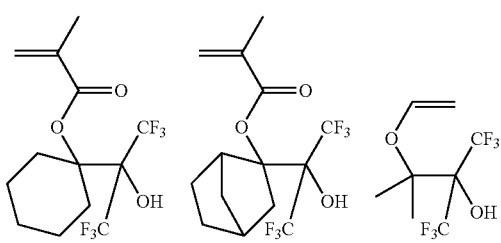
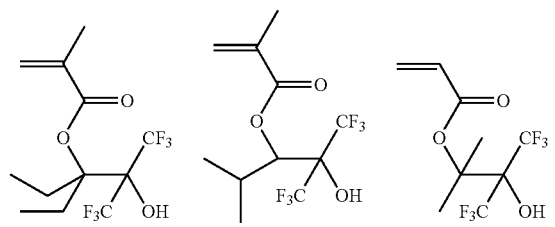
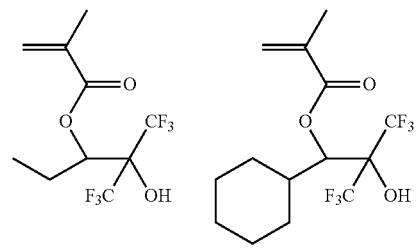
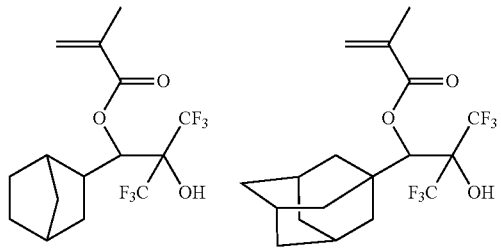
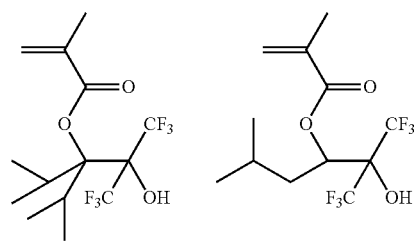
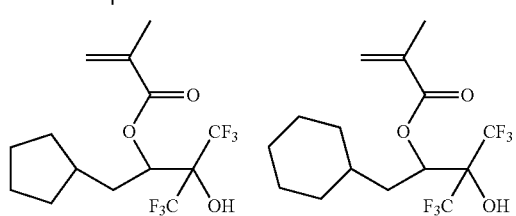
-continued
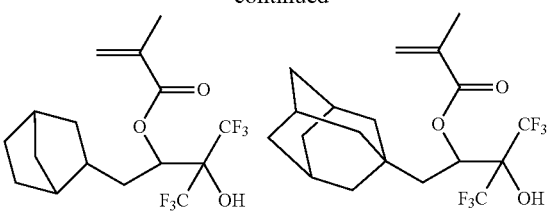
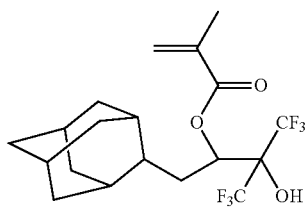
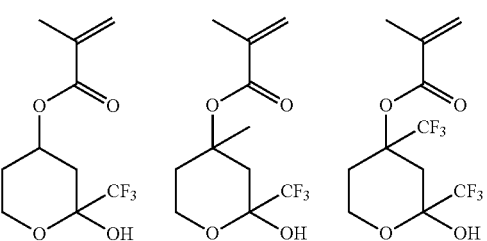
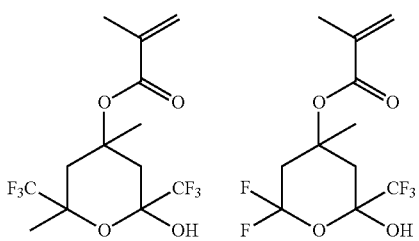
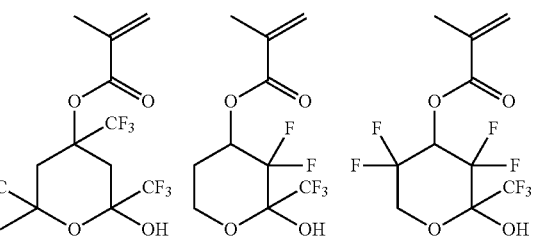
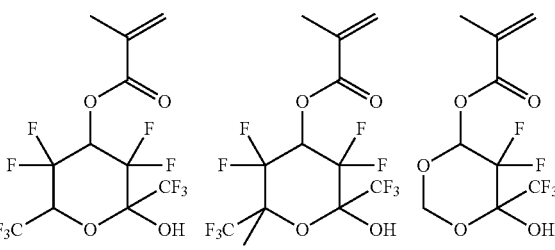
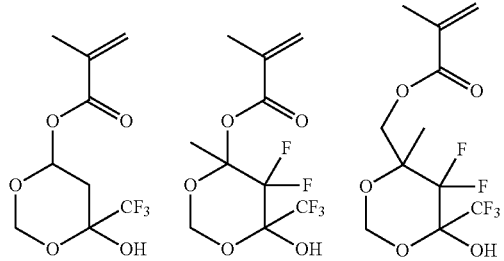

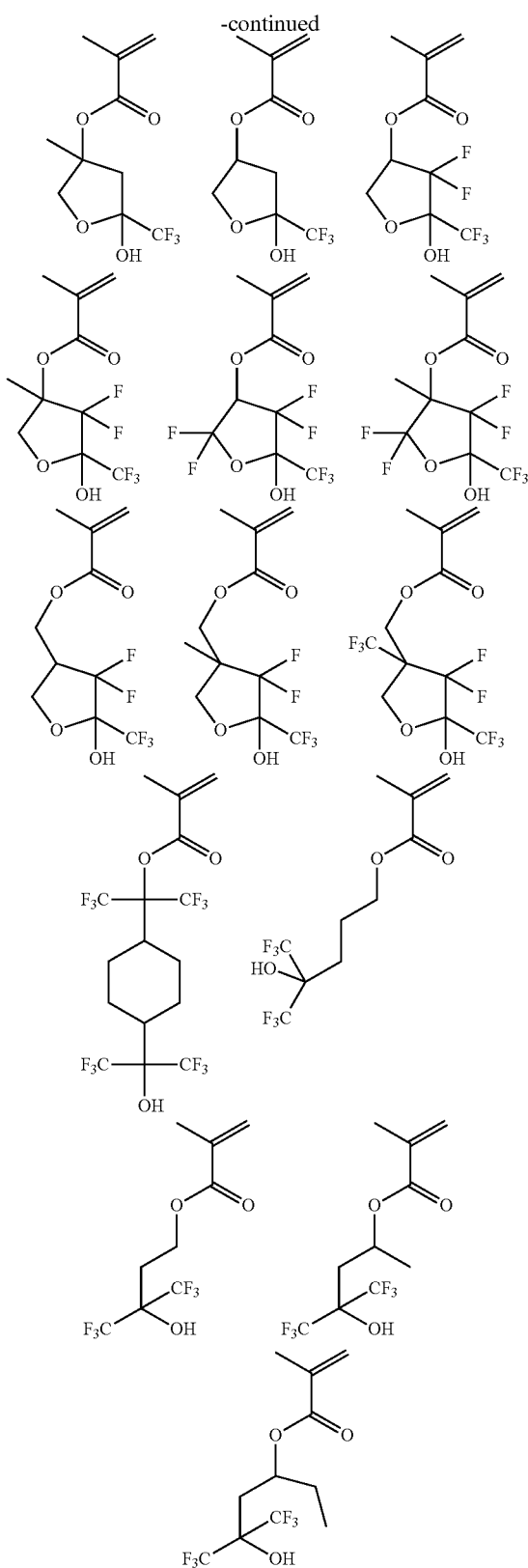

A method for synthesizing the dopant polymer of Component (B) may be shown a method, for example, in which a desired monomer(s) among the monomers providing the repeating units "a" to "c" is/are subjected to polymerization under heating in an organic solvent by adding a radical polymerization initiator to obtain a dopant polymer which is a (co)polymer.

The organic solvent to be used at the time of the polymerization may be exemplified by toluene, benzene, tetrahydrofuran, diethyl ether, dioxane, cyclohexane, cyclopentane, methyl ethyl ketone, and γ-butyrolactone.

The radical polymerization initiator may be exemplified by 2,2'-azobisisobutyronitrile (AIBN), 2,2'-azobis(2,4-dimethylvaleronitrile), dimethyl 2,2'-azobis(2-methylpropionate), benzoyl peroxide, and lauroyl peroxide.

A reaction temperature is preferably 50 to 80° C., and a reaction time is preferably 2 to 100 hours, more preferably 5 to 20 hours.

In the dopant polymer of Component (B), the monomer providing the repeating unit "a" may be either one kind or two or more kinds, and it is preferable to use a methacryl type monomer and a styrene type monomer in combination to heighten polymerizability.

Moreover, when two or more kinds of the monomers providing the repeating unit "a" are used, the respective monomers may be randomly copolymerized, or may be copolymerized in block. When it is made a block copolymerized polymer (a block copolymer), the repeating parts comprising two or more kinds of the repeating units "a"s aggregate to form a sea-island structure, whereby a specific structure is generated around the dopant polymer, and as a result, a merit of improving conductivity can be expected.

In addition, the monomer providing the repeating units "a" to "c" may be randomly copolymerized, or may be copolymerized in block. In this case, as in the case of the repeating unit "a", a merit of improving conductivity can be expected by making it a block copolymer.

When the random copolymerization is carried out by the radical polymerization, it is a general method that monomers to be carried out the copolymerization and a radical polymerization initiator are mixed and polymerized under heating. Polymerization is started in the presence of a first monomer and a radical polymerization initiator, and when a second monomer is added later, one side of the polymer molecule is a structure in which the first monomer is polymerized, and the other side is a structure in which the second monomer is polymerized. In this case, however, the repeating units of the first monomer and the second monomer are mixedly present in the intermediate portion, and the form is different from that of the block copolymer. For forming the block copolymer by the radical polymerization, living radical polymerization is preferably used.

In the polymerization method of a living radical called as the RAFT polymerization (Reversible Addition Fragmentation chain Transfer polymerization), the radical at the end of the polymer is always living, so that polymerization is started with the first monomer, and at the stage when it is consumed, by adding the second monomer, it is possible to form a di-block copolymer with a block of the repeating unit of the first monomer and a block of the repeating unit of the second monomer. Further, when polymerization is started with the first monomer, and at the stage when it is consumed, the second monomer is added, and then, a third monomer is added, then, a tri-block copolymer can be formed.

When the RAFT polymerization is carried out, there is a characteristic that a narrow dispersion polymer in which a molecular weight distribution (dispersity) is narrow is formed, and in particular, when the RAFT polymerization is carried out by adding the monomer at a time, a polymer having a narrower molecular weight distribution can be formed.

It is to be noted that, in the dopant polymer of Component (B), the molecular weight distribution (Mw/Mn) is preferably 1.0 to 2.0, and particularly preferably a narrow dispersion of 1.0 to 1.5. If it is a narrow dispersion, it is possible to prevent the transmittance of the conductive film formed by the conductive polymer composite using the polymer from being lowered.

For carrying out the RAFT polymerization, a chain transfer agent is necessary, and it may be specifically mentioned 2-cyano-2-propylbenzothioate, 4-cyano-4-phenyl-carbonothioylthiopentanoic acid, 2-cyano-2-propyl dodecyl trithiocarbonate, 4-cyano-4-[(dodecylsulfanylthiocarbonyl)-sulfanyl]pentanoic acid, 2-(dodecylthiocarbonothioylthio)-2-methylpropanoic acid, cyanomethyl dodecyl thiocarbonate, cyanomethyl methyl(phenyl)carbamothioate, bis(thiobenzoyl) disulfide, and bis(dodecylsulfanylthiocarbonyl)disulfide. Among these, 2-cyano-2-propylbenzothioate is particularly preferable.

When the dopant polymer of Component (B) contains the repeating unit "c", a ratio of the repeating units "a" to "c" is preferably 0<a≤1.0, 0≤b<1.0, and 0<c<1.0, more preferably 0.1≤a≤0.9, 0.1≤b≤0.9, and 0<c≤0.8, and further preferably 0.2≤a≤0.8, 0.2≤b≤0.8, and 0<c≤0.5.

Incidentally, it is preferable that a+b+c=1.

The dopant polymer of Component (B) has a weight average molecular weight in the range of 1,000 to 500,000, preferably in the range of 2,000 to 200,000. If the weight average molecular weight is less than 1,000, the product is inferior in heat resistance, and uniformity of a composite solution with Component (A) is worsened. On the other hand, if the weight average molecular weight exceeds 500,000, in addition to worsening of conductivity, the viscosity is increased to worsen workability, and dispersibility in water or an organic solvent is lowered.

It is to be noted that the weight average molecular weight (Mw) is a measured value in terms of polyethylene oxide, polyethylene glycol, or polystyrene, by gel permeation chromatography (GPC) using water, dimethylformamide (DMF), or tetrahydrofuran (THF) as a solvent.

It is to be noted that, as the monomer constituting the dopant polymer of Component (B), whereas a monomer having a sulfonamide group may be used, a polymerization reaction is carried out by using a monomer which is a lithium salt, a sodium salt, a potassium salt, an ammonium salt, or a sulfonium salt of a sulfonamide group, and after the polymerization, it may be changed to a sulfonamide group by using an ion exchange resin.

[Conductive Polymer Composite]

The conductive polymer composite of the present invention contains the π-conjugated polymer of Component (A) and the dopant polymer of Component (B), and the dopant polymer of Component (B) is coordinated to the π-conjugated polymer of Component (A) to form a composite.

The conductive polymer composite of the present invention is preferably in the form of particles having dispersibility in water or an organic solvent, whereby film formability by spin coating to an inorganic or organic substrate (a substrate in which an inorganic film or an organic film is formed onto the surface of the substrate) or flatness of a film can be made good. A size of the particles can be measured by the light scattering method or the X-ray scattering method.

(Producing Method of Conductive Polymer Composite)

The composite of Component (A) and Component (B) can be obtained by, for example, adding a monomer (preferably pyrrole, thiophene, aniline, or a derivative monomer thereof) which becomes a raw material of Component (A) to an aqueous solution of Component (B) or a mixed solution of water and an organic solvent with Component (B), and adding an oxidizing agent and, if necessary, an oxidizing catalyst, to carry out oxidative polymerization.

The oxidizing agent and the oxidizing catalyst which can be used may be shown a peroxodisulfate (persulfate) such as ammonium peroxodisulfate (ammonium persulfate), sodium peroxodisulfate (sodium persulfate), and potassium peroxodisulfate (potassium persulfate), a transition metal compound such as ferric chloride, ferric sulfate, and cupric chloride, a metal oxide such as silver oxide, and cesium oxide, a peroxide such as hydrogen peroxide, and ozone, an organic peroxide such as benzoyl peroxide, oxygen, and the like.

As the reaction solvent to be used for carrying out the oxidative polymerization, water or a mixed solvent of water and a solvent may be used. The solvent herein used is preferably a solvent which is miscible with water, and can dissolve or disperse Component (A) and Component (B). There may be shown, for example, a polar solvent such as N-methyl-2-pyrrolidone, N,N'-dimethylformamide, N,N'-dimethylacetamide, dimethylsulfoxide, and hexamethylphosphorous triamide, alcohols such as methanol, ethanol, propanol, and butanol, polyvalent aliphatic alcohols such as ethylene glycol, propylene glycol, dipropylene glycol, 1,3-butylene glycol, 1,4-butylene glycol, D-glucose, D-glucitol, isoprene glycol, butanediol, 1,5-pentanediol, 1,6-hexanediol, 1,9-nonanediol, and neopentyl glycol, carbonate compounds such as ethylene carbonate, and propylene carbonate, cyclic ether compounds such as dioxane, and tetrahydrofuran, linear ethers such as dialkyl ether, ethylene glycol monoalkyl ether, ethylene glycol dialkyl ether, propylene glycol monoalkyl ether, propylene glycol dialkyl ether, polyethylene glycol dialkyl ether, and polypropylene glycol dialkyl ether, heterocyclic compounds such as 3-methyl-2-oxazolidinone, nitrile compounds such as acetonitrile, glutaronitrile, methoxyacetonitrile, propionitrile, and benzonitrile. These solvents may be used alone or a mixture of two or more kinds. A formulation amount of the solvents miscible with water is preferably 50% by mass or less based on the whole reaction solvent.

In addition, an anion which is capable of doping in the π-conjugated polymer of Component (A) may be used in combination other than the dopant polymer of Component (B). Such an anion may be preferably mentioned an organic acid, from the viewpoints of adjusting dedoping characteristics from the π-conjugated polymer, dispersibility of the conductive polymer composite, heat resistance, and environmental resistance characteristics. The organic acid may be shown an organic carboxylic acid, phenols, and an organic sulfonic acid.

As the organic carboxylic acid, a material in which one or two or more carboxyl groups is/are contained in an aliphatic, an aromatic, or a cycloaliphatic may be used. There may be shown, for example, formic acid, acetic acid, oxalic acid, benzoic acid, phthalic acid, maleic acid, fumaric acid, malonic acid, tartaric acid, citric acid, lactic acid, succinic acid, monochloroacetic acid, dichloroacetic acid, trichloroacetic acid, trifluoroacetic acid, nitroacetic acid, and triphenylacetic acid.

The phenols may be shown phenols such as cresol, phenol, and xylenol.

As the organic sulfonic acid, a material in which one or two or more sulfonic acid groups is/are contained in an aliphatic, an aromatic, or a cycloaliphatic may be used.

Examples containing one sulfonic acid group may be shown, for example, a sulfonic acid compound containing a sulfonic acid group such as methanesulfonic acid, ethanesulfonic acid, 1-propanesulfonic acid, 1-butanesulfonic acid, 1-hexanesulfonic acid, 1-heptanesulfonic acid, 1-octanesulfonic acid, 1-nonanesulfonic acid, 1-decanesulfonic acid, 1-dodecanesulfonic acid, 1-tetradecanesulfonic acid, 1-pentadecanesulfonic acid, 2-bromoethanesulfonic acid, 3-chloro-2-hydroxypropanesulfonic acid, trifluoromethanesulfonic acid, colistinmethanesulfonic acid, 2-acrylamido-2-methylpropanesulfonic acid, aminomethanesulfonic acid, 1-amino-2-naphthol-4-sulfonic acid, 2-amino-5-naphthol-7-sulfonic acid, 3-aminopropanesulfonic acid, N-cyclohexyl-3-aminopropanesulfonic acid, benzenesulfonic acid, p-toluene-sulfonic acid, xylenesulfonic acid, ethylbenzenesulfonic acid, propylbenzenesulfonic acid, butylbenzenesulfonic acid, pentylbenzenesulfonic acid, hexylbenzenesulfonic acid, heptylbenzenesulfonic acid, octylbenzenesulfonic acid, nonylbenzenesulfonic acid, decylbenzenesulfonic acid, undecylbenzenesulfonic acid, dodecylbenzenesulfonic acid, pentadecylbenzenesulfonic acid, hexadecylbenzenesulfonic acid, 2,4-dimethylbenzenesulfonic acid, dipropylbenzenesulfonic acid, 4-aminobenzenesulfonic acid, o-aminobenzenesulfonic acid, m-aminobenzenesulfonic acid, 4-amino-2-chlorotoluene-5-sulfonic acid, 4-amino-3-methylbenzene-1-sulfonic acid, 4-amino-5-methoxy-2-methylbenzenesulfonic acid, 2-amino-5-methylbenzene-1-sulfonic acid, 4-amino-2-methylbenzene-1-sulfonic acid, 5-amino-2-methylbenzene-1-sulfonic acid, 4-acetamido-3-chlorobenzenesulfonic acid, 4-chloro-3-nitrobenzenesulfonic acid, p-chlorobenzenesulfonic acid, naphthalenesulfonic acid, methylnaphthalenesulfonic acid, propylnaphthalenesulfonic acid, butylnaphthalene-sulfonic acid, pentylnaphthalenesulfonic acid, dimethyl-naphthalenesulfonic acid, 4-amino-1-naphthalenesulfonic acid, 8-chloronaphthalene-1-sulfonic acid, naphthalenesulfonic acid formalin polycondensate, and melaminesulfonic acid formalin polycondensate.

Examples containing two or more sulfonic acid groups may be shown, for example, ethanedisulfonic acid, butanedisulfonic acid, pentanedisulfonic acid, decanedisulfonic acid, m-benzenedisulfonic acid, o-benzenedisulfonic acid, p-benzenedisulfonic acid, toluenedisulfonic acid, xylenedisulfonic acid, chlorobenzenedisulfonic acid, fluorobenzenedisulfonic acid, aniline-2,4-disulfonic acid, aniline-2,5-disulfonic acid, diethylbenzenedisulfonic acid, dibutylbenzenedisulfonic acid, naphthalenedisulfonic acid, methylnaphthalenedisulfonic acid, ethylnaphthalenedisulfonic acid, dodecylnaphthalenedisulfonic acid, pentadecylnaphthalenedisulfonic acid, butylnaphthalenedisulfonic acid, 2-amino-1,4-benzenedisulfonic acid, 1-amino-3,8-naphthalenedisulfonic acid, 3-amino-1,5-naphthalenedisulfonic acid, 8-amino-1-naphthol-3,6-disulfonic acid, anthracenedisulfonic acid, butyl-anthracenedisulfonic acid, 4-acetamido-4'-isothiocyanato-stilbene-2,2'-disulfonic acid, 4-acetamido-4'-maleimidyl-stilbene-2,2'-disulfonic acid, 1-acetoxypyrene-3,6,8-trisulfonic acid, 7-amino-1,3,6-naphthalenetrisulfonic acid, 8-aminonaphthalene-1,3,6-trisulfonic acid, and 3-amino-1,5,7-naphthalenetrisulfonic acid.

These anions other than Component (B) may be added to the solution containing the starting monomer of Component (A), Component (B), an oxidizing agent and/or an oxidative polymerization catalyst before polymerization of Component (A), or may be added to the conductive polymer composite (solution) containing Component (A) and Component (B) after the polymerization.

The thus obtained composite of Component (A) and Component (B) can be used, if necessary, by finely pulverizing with a homogenizer or a ball mill.

For fine pulverization, a mixing-dispersing machine which can provide high shearing force is preferably used. As the mixing-dispersing machine, there may be shown, for example, a homogenizer, a high-pressure homogenizer, and a bead mill, and among these, a high-pressure homogenizer is preferable.

Specific examples of the high-pressure homogenizer may be shown Nanovater manufactured by Yoshida Kikai Co., Ltd., Microfluidizer manufactured by Powrex Corp., Artimizer manufactured by SUGINO MACHINE LIMITED.

A dispersing treatment using the high-pressure homogenizer may be shown, for example, a treatment in which the solution of the composite before subjecting to the dispersing treatment is subjected to counter-collision with high pressure, and a treatment in which it is passed through an orifice or slit with high pressure.

Before or after fine pulverization, impurities are removed by a method such as filtration, ultrafiltration, and dialysis, and may be purified by a cation-exchange resin, an anion-exchange resin, and a chelate resin.

The total content of Component (A) and Component (B) in the solution of the conductive polymer composite is preferably 0.05 to 5.0% by mass. If the total content of Component (A) and Component (B) is 0.05% by mass or more, sufficient conductivity can be obtained, and if it is 5.0% by mass or less, a uniform conductive coating film can be easily obtained.

The content of Component (B) is preferably an amount in which the sulfonamide group in Component (B) is in the range of 0.1 to 10 mol based on 1 mol of Component (A), and more preferably an amount in the range of 1 to 7 mol. If the sulfonamide group in Component (B) is 0.1 mol or more, the doping effect to Component (A) is high, and sufficient conductivity can be ensured. In addition, if the sulfonamide group in Component (B) is 10 mol or less, the content of Component (A) becomes suitable, and sufficient conductivity can be obtained.

As the organic solvent which can be added to the aqueous solution for the polymerization reaction, or can dilute the monomer, there may be shown methanol, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycoldimethyl ether, diethylene glycoldimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone and a mixture thereof.

It is to be noted that the amount of the organic solvent to be used is preferably 0 to 1,000 mL based on 1 mol of the monomer, particularly preferably 0 to 500 mL. If the amount of the organic solvent to be used is 1,000 mL or less, the reaction vessel does not become too large so that it is economical.

[Other components](Surfactant) In the present invention, a surfactant may be added to increase wettability to a material to be processed such as a substrate. Such a surfactant may be shown various kinds of surfactants such as nonionic, cationic, and anionic surfactants. More specifically, there may be shown, for example, nonionic surfactants such as polyoxyethylene alkyl ether, polyoxyethylene alkylphenyl ether, polyoxyethylene carboxylic acid ester, sorbitan ester, and polyoxyethylene sorbitan ester, cationic surfactants such as alkyltrimethyl ammonium chloride, and alkylbenzyl ammonium chloride, an anionic surfactants such as an alkyl or alkylallyl sulfate, an alkyl or alkylallylsulfonic acid salt, and a dialkylsulfosuccinic acid salt, amphoteric ionic surfactants such as an amino acid-type, and a betaine-type, acetylene alcohol-based surfactants, and acetylene alcohol-based surfactants in which the hydroxyl group is converted into polyethylene oxide or polypropylene oxide.

(High conducting agent) In the present invention, an organic solvent may be added separating from the main solvent for the purpose of improving conductivity of the conductive polymer composite. Such an additive solvent may be shown a polar solvent, and specifically mentioned ethylene glycol, diethylene glycol, polyethylene glycol, propylene glycol, dimethylsulfoxide (DMSO), dimethylformamide (DMF), N-methyl-2-pyrrolidone (NMP), sulfolane and a mixture thereof. An amount to be added thereof is preferably 1.0 to 30.0% by mass, and particularly preferably 3.0 to 10.0% by mass.

(Neutralizing Agent)

In the present invention, a pH of the conductive polymer composite in an aqueous solution is acidic. For the purpose of neutralizing it, it is possible that the nitrogen-containing aromatic cyclic compound disclosed at the paragraphs [0033] to [0045] of JP 2006-96975A and the cation disclosed at the paragraph [0127] of JP U.S. Pat. No. 5,264,723 is added to control the pH to neutral. By making the pH of the solution close to neutral, occurrence of rust can be prevented when applied it to a printing press.

When the conductive polymer composite of the present invention is employed, a conductive film having good filterability and film formability by spin coating, high transparency and low surface roughness can be formed.

[Conductive Film]

The conductive polymer composite (solution) thus obtained can form a conductive film by coating it onto a material to be processed such as a substrate. The coating method of the conductive polymer composite (solution) may be shown, for example, coating by a spin coater, a bar coater, dipping, comma coating, spray coating, roll coating, screen printing, flexographic printing, gravure printing, and ink-jet printing. After coating, a heat treatment by a hot air circulation furnace, or a hot plate, or IR, or UV irradiation, is carried out to form a conductive film.

Thus, the conductive polymer composite of the present invention can be made a conductive film by coating onto a substrate, and forming a film. In addition, the thus formed conductive film is excellent in conductivity and transparency, so that it can be made a material which acts as a transparent electrode layer and a hole injection layer.

[Substrate]

Further, the present invention is to provide a substrate onto which the conductive film is formed by the conductive polymer composite of the present invention.

The substrate may be shown a glass substrate, a quartz substrate, a photomask blank substrate, a resin substrate, a silicon wafer, a compound semiconductor wafer such as a gallium arsenide wafer, and indium phosphide wafer, and a flexible substrate. In addition, it may be coated onto a photoresist film and used as an antistatic top coating.

When the conductive polymer composite of the present invention is employed, since the dopant polymer of Component (B) containing the sulfonamide group as a strong acid forms a complex with the π-conjugated polymer of Component (A), the material is low viscosity, filterability of which is good and film formability by spin coating of which is good, and when a film is formed, it is possible to form a conductive film which film is good in transparency, flatness and durability, and a light emission lifetime of an organic EL. Further, when such a conductive polymer composite is employed, affinity to an organic solvent or an organic substrate is good, and film formability becomes good both to an organic substrate and an inorganic substrate.

Further, the conductive film formed by such a conductive polymer composite is excellent in conductivity and transparency, so that it can be made a material which acts as a transparent electrode layer.

EXAMPLE

In the following, the present invention is more specifically explained by referring to Synthesis Examples, Preparation Examples, Comparative Preparation Examples, Examples, and Comparative Example, but the present invention is not limited by these.

In the following, the monomers used in Synthesis Examples are shown.

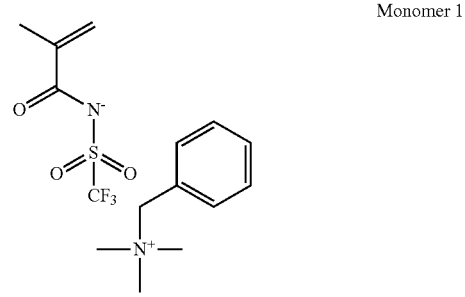

Monomer 1

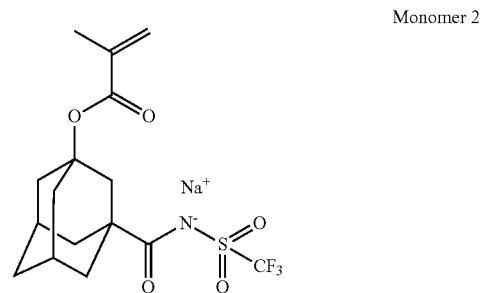

Monomer 2

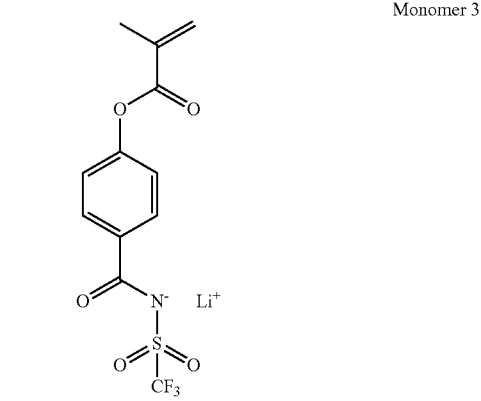

Monomer 3

Monomer 4

Synthesis of Dopant Polymer

Synthesis Example 1

Under nitrogen atmosphere, to 37.5 g of methanol stirred at 64° C. were added dropwise a solution of 36.4 g of the monomer 1 and 5.13 g of dimethyl 2,2'-azobis(isobutyrate) dissolved in 112.5 g of methanol over 4 hours. The mixture was further stirred at 64° C. for 4 hours. After cooling the mixture to room temperature, the mixture was added dropwise to 1,000 g of ethyl acetate while vigorously stirring. The formed solid product was collected by filtration, and dried under vacuum at 50° C. for 15 hours to obtain 23.0 g of a white polymer.

The obtained white polymer was dissolved in 912 g of pure water, and the benzyltrimethyl ammonium salt was changed to a sulfonamide group by using an ion exchange resin. When the obtained polymer was measured by using $^{19}$F-NMR, 1H-NMR, and GPC, the following analytical results were obtained.

Weight average molecular weight (Mw)=35,000
Molecular weight distribution (Mw/Mn)=1.69
This polymer compound is made (Dopant polymer 1).

Dopant polymer 1

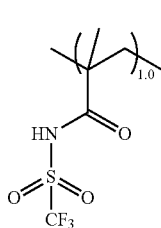

Synthesis Example 2

Under nitrogen atmosphere, to 37.5 g of methanol stirred at 64° C. were added dropwise a solution of 20.9 g of the monomer 1, 9.5 g of lithium styrene sulfonate and 5.13 g of dimethyl 2,2'-azobis(isobutyrate) dissolved in 112.5 g of methanol over 4 hours. The mixture was further stirred at 64° C. for 4 hours. After cooling the mixture to room temperature, the mixture was added dropwise to 1,000 g of ethyl acetate while vigorously stirring. The formed solid product was collected by filtration, and dried under vacuum at 50° C. for 15 hours to obtain 29.3 g of a white polymer.

The obtained white polymer was dissolved in 912 g of pure water, and the benzyltrimethyl ammonium salt and the lithium salt were changed to a sulfonamide group and a sulfo group, respectively, by using an ion exchange resin. When the obtained polymer was measured by using $^{19}$F-NMR, 1H-NMR, and GPC, the following analytical results were obtained.

Copolymer compositional ratio (molar ratio) the monomer 1:styrene sulfonic acid=0.5:0.5
Weight average molecular weight (Mw)=41,000
Molecular weight distribution (Mw/Mn)=1.93
This polymer compound is made (Dopant polymer 2).

Dopant polymer 2

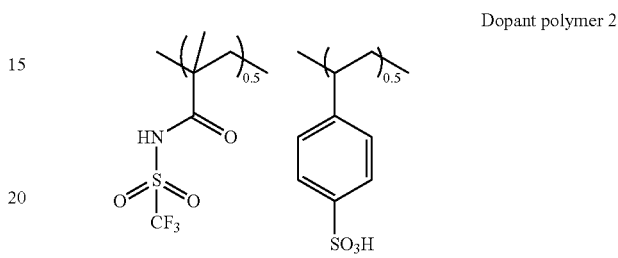

Synthesis Example 3

Under nitrogen atmosphere, to 37.5 g of methanol stirred at 64° C. were added dropwise a solution of 41.7 g of the monomer 2 and 5.13 g of dimethyl 2,2'-azobis(isobutyrate) dissolved in 112.5 g of methanol over 4 hours. The mixture was further stirred at 64° C. for 4 hours. After cooling the mixture to room temperature, the mixture was added dropwise to 1,000 g of ethyl acetate while vigorously stirring. The formed solid product was collected by filtration, and dried under vacuum at 50° C. for 15 hours to obtain 33.2 g of a white polymer.

The obtained white polymer was dissolved in 912 g of pure water, and the sodium salt was changed to a sulfonamide group by using an ion exchange resin. When the obtained polymer was measured by using $^{19}$F-NMR, 1H-NMR, and GPC, the following analytical results were obtained.

Weight average molecular weight (Mw)=49,000
Molecular weight distribution (Mw/Mn)=1.51
This polymer compound is made (Dopant polymer 3).

Dopant polymer 3

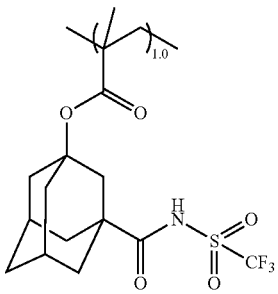

Synthesis Example 4

Under nitrogen atmosphere, to 37.5 g of methanol stirred at 64° C. were added dropwise a solution of 17.2 g of the monomer 3, 9.5 g of lithium styrene sulfonate and 5.13 g of dimethyl 2,2'-azobis(isobutyrate) dissolved in 112.5 g of methanol over 4 hours. The mixture was further stirred at 64° C. for 4 hours. After cooling the mixture to room temperature, the mixture was added dropwise to 1,000 g of ethyl acetate while vigorously stirring. The formed solid product was collected by filtration, and dried under vacuum at 50° C. for 15 hours to obtain 24.1 g of a white polymer.

The obtained white polymer was dissolved in 912 g of pure water, and the lithium salt was changed to a sulfonamide group and a sulfo group, respectively, by using an ion exchange resin. When the obtained polymer was measured by using $^{19}$F-NMR, 1H-NMR, and GPC, the following analytical results were obtained.

Copolymer compositional ratio (molar ratio) the monomer 3:styrene sulfonic acid=0.5:0.5 Weight average molecular weight (Mw)=41,000 Molecular weight distribution (Mw/Mn)=1.63 This polymer compound is made (Dopant polymer 4).

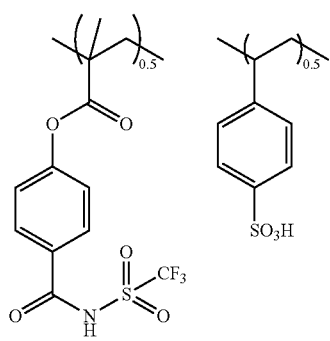

Dopant polymer 4

Synthesis Example 5

Under nitrogen atmosphere, to 37.5 g of methanol stirred at 64° C. were added dropwise a solution of 30.1 g of the monomer 4 and 5.13 g of dimethyl 2,2'-azobis(isobutyrate) dissolved in 112.5 g of methanol over 4 hours. The mixture was further stirred at 64° C. for 4 hours. After cooling the mixture to room temperature, the mixture was added dropwise to 1,000 g of ethyl acetate while vigorously stirring. The formed solid product was collected by filtration, and dried under vacuum at 50° C. for 15 hours to obtain 27.5 g of a white polymer.

The obtained white polymer was dissolved in 912 g of pure water, and the sodium salt was changed to a sulfonamide group by using an ion exchange resin. When the obtained polymer was measured by using 19F-NMR, 1H-NMR, and GPC, the following analytical results were obtained.

Weight average molecular weight (Mw)=38,000

Molecular weight distribution (Mw/Mn)=1.49

This polymer compound is made (Dopant polymer 5).

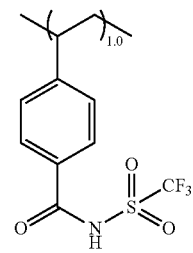

Dopant polymer 5

Synthesis Example 6

Under nitrogen atmosphere, to 37.5 g of methanol stirred at 64° C. were added dropwise a solution of 29.1 g of the monomer 1, 10 g of 3,5-bis(hexafluoro-2-hydroxy-2-propyl)cyclohexyl methacrylate and 5.13 g of dimethyl 2,2'-azobis(isobutyrate) dissolved in 112.5 g of methanol over 4 hours. The mixture was further stirred at 64° C. for 4 hours. After cooling the mixture to room temperature, the mixture was added dropwise to 1,000 g of ethyl acetate while vigorously stirring. The formed solid product was collected by filtration, and dried under vacuum at 50° C. for 15 hours to obtain 37.5 g of a white polymer.

The obtained white polymer was dissolved in 912 g of pure water, and the benzyltrimethyl ammonium salt was changed to a sulfonamide group by using an ion exchange resin. When the obtained polymer was measured by using 19F-NMR, 1H-NMR, and GPC, the following analytical results were obtained.

Copolymer compositional ratio (molar ratio) the monomer 1:3,5-bis(hexafluoro-2-hydroxy-2-propyl)cyclohexyl methacrylate=0.8:0.2

Weight average molecular weight (Mw)=36,000

Molecular weight distribution (Mw/Mn)=1.88

This polymer compound is made (Dopant polymer 6).

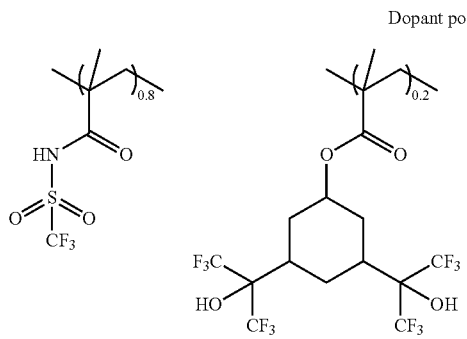

Dopant polymer 6

Synthesis Example 7

Under nitrogen atmosphere, to 37.5 g of methanol stirred at 64° C. were added dropwise a solution of 29.1 g of the monomer 1, 3.9 g of pentafluorostyrene and 5.13 g of dimethyl 2,2'-azobis(isobutyrate) dissolved in 112.5 g of methanol over 4 hours. The mixture was further stirred at 64° C. for 4 hours. After cooling the mixture to room temperature, the mixture was added dropwise to 1,000 g of ethyl acetate while vigorously stirring. The formed solid product was collected by filtration, and dried under vacuum at 50° C. for 15 hours to obtain 27.5 g of a white polymer.

The obtained white polymer was dissolved in 912 g of pure water, and the benzyltrimethyl ammonium salt was changed to a sulfonamide group by using an ion exchange resin. When the obtained polymer was measured by using $^{19}$F-NMR, $^1$H-NMR, and GPC, the following analytical results were obtained.

Copolymer compositional ratio (molar ratio) the monomer 1:pentafluorostyrene=0.8:0.2
  Weight average molecular weight (Mw)=36,000
  Molecular weight distribution (Mw/Mn)=1.88
  This polymer compound is made (Dopant polymer 7).

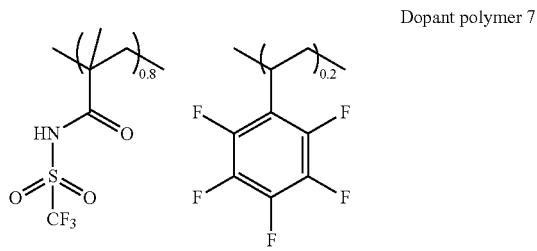

Dopant polymer 7

Synthesis Example 8

Under nitrogen atmosphere, to 37.5 g of methanol stirred at 64° C. were added dropwise a solution of 29.1 g of the monomer 1, 5.4 g of 4-(hexafluoro-2-hydroxy-2-propyl)-styrene and 5.13 g of dimethyl 2,2'-azobis(isobutyrate) dissolved in 112.5 g of methanol over 4 hours. The mixture was further stirred at 64° C. for 4 hours. After cooling the mixture to room temperature, the mixture was added dropwise to 1,000 g of ethyl acetate while vigorously stirring. The formed solid product was collected by filtration, and dried under vacuum at 50° C. for 15 hours to obtain 30.1 g of a white polymer.

The obtained white polymer was dissolved in 912 g of pure water, and the benzyltrimethyl ammonium salt was changed to a sulfonamide group by using an ion exchange resin. When the obtained polymer was measured by using $^{19}$F-NMR, 1H-NMR, and GPC, the following analytical results were obtained.

Copolymer compositional ratio (molar ratio) the monomer 1:4-(hexafluoro-2-hydroxy-2-propyl)styrene=0.8:0.2
  Weight average molecular weight (Mw)=32,000
  Molecular weight distribution (Mw/Mn)=1.78
  This polymer compound is made (Dopant polymer 8).

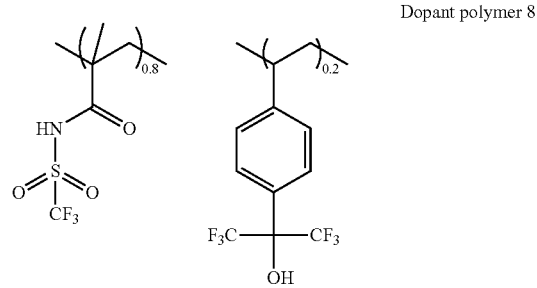

Dopant polymer 8

Preparation of Conductive Polymer Composite Dispersion

Preparation Example 1

3.82 g of 3,4-ethylenedioxythiophene and a solution in which 8.2 g of Dopant polymer 1 has been dissolved in 1,000 mL of ultrapure water were mixed at 30° C.

The thus obtained mixed solution was maintained at 30° C., and under stirring, 8.40 g of sodium persulfate dissolved in 100 mL of ultrapure water and an oxidation catalyst solution of 2.3 g of ferric sulfate were gradually added thereto and stirred for 4 hours to react these materials.

To the obtained reaction mixture was added 1,000 mL of ultrapure water, and about 1,000 mL of the solution was removed by using the ultrafiltration method. This operation was repeated three times.

Then, to the processed solution to which the filtration treatment has been carried out were added 200 mL of sulfuric acid diluted to 10% by mass and 2,000 mL of deionized water, about 2,000 mL of the processed solution was removed by using the ultrafiltration method, 2,000 mL of deionized water was added thereto, and about 2,000 mL of the solution was removed by using the ultrafiltration method. This operation was repeated three times.

Further, to the obtained processed solution was added 2,000 mL of deionized water, about 2,000 mL of the processed solution was removed by using the ultrafiltration method. This operation was repeated five times, to obtain 1.3% by mass of a blue-colored conductive polymer composite dispersion 1.

The ultrafiltration conditions are as follows.
Molecular weight cutoff of ultrafiltration membrane: 30K Cross Flow Type
Flow amount of supplied liquid: 3,000 mL/min
Membrane partial pressure: 0.12 Pa
Ultrafiltration was carried out with the same conditions in the other Preparation Examples.

Preparation Example 2

Preparation was carried out in the same manner as in Preparation Example 1 except for changing 8.2 g of Dopant polymer 1 to 7.6 g of Dopant polymer 2, to obtain the conductive polymer composite dispersion 2.

Preparation Example 3

Preparation was carried out in the same manner as in Preparation Example 1 except for changing 8.2 g of Dopant polymer 1 to 15.1 g of Dopant polymer 3, to obtain a conductive polymer composite dispersion 3.

Preparation Example 4

Preparation was carried out in the same manner as in Preparation Example 1 except for changing 8.2 g of Dopant polymer 1 to 9.9 g of Dopant polymer 4, to obtain a conductive polymer composite dispersion 4.

Preparation Example 5

Preparation was carried out in the same manner as in Preparation Example 1 except for changing 8.2 g of Dopant polymer 1 to 10.6 g of Dopant polymer 5, to obtain a conductive polymer composite dispersion 5.

Preparation Example 6

Preparation was carried out in the same manner as in Preparation Example 1 except for changing 8.2 g of Dopant polymer 1 to 10.5 g of Dopant polymer 6, to obtain a conductive polymer composite dispersion 6.

Preparation Example 7

Preparation was carried out in the same manner as in Preparation Example 1 except for changing 8.2 g of Dopant polymer 1 to 8.1 g of Dopant polymer 7, to obtain a conductive polymer composite dispersion 7.

Preparation Example 8

Preparation was carried out in the same manner as in Preparation Example 1 except for changing 8.2 g of Dopant polymer 1 to 8.1 g of Dopant polymer 8, to obtain a conductive polymer composite dispersion 8.

Preparation Example 9

3.87 g of 3,4-dimethoxythiophene and a solution in which 8.2 g of Dopant polymer 1 has been dissolved in 1,000 mL of ultrapure water were mixed at 30° C.

The thus obtained mixed solution was maintained at 30° C., and under stirring, 8.40 g of sodium persulfate dissolved in 100 mL of ultrapure water and an oxidation catalyst solution of 2.3 g of ferric sulfate were gradually added thereto and stirred for 4 hours to react these materials.

To the obtained reaction mixture was added 1,000 mL of ultrapure water, and about 1,000 mL of the solution was removed by using the ultrafiltration method. This operation was repeated three times.

Then, to the processed solution to which the filtration treatment has been carried out were added 200 mL of sulfuric acid diluted to 10% by mass and 2,000 mL of deionized water, about 2,000 mL of the processed solution was removed by using the ultrafiltration method, 2,000 mL of deionized water was added thereto, and about 2,000 mL of the solution was removed by using the ultrafiltration method. This operation was repeated three times.

Further, to the obtained processed solution was added 2,000 mL of deionized water, about 2,000 mL of the processed solution was removed by using the ultrafiltration method. This operation was repeated five times, to obtain 1.3% by mass of a blue-colored conductive polymer composite dispersion 9.

Preparation Example 10

4.62 g of (2,3-dihydrothieno[3,4-b] [1,4]dioxin-2-yl) methanol and a solution in which 8.2 g of Dopant polymer 1 has been dissolved in 1,000 mL of ultrapure water were mixed at 30° C.

The thus obtained mixed solution was maintained at 30° C., and under stirring, 8.40 g of sodium persulfate dissolved in 100 mL of ultrapure water and an oxidation catalyst solution of 2.3 g of ferric sulfate were gradually added thereto and stirred for 4 hours to react these materials.

To the obtained reaction mixture was added 1,000 mL of ultrapure water, and about 1,000 mL of the solution was removed by using the ultrafiltration method. This operation was repeated three times.

Then, to the processed solution to which the filtration treatment has been carried out were added 200 mL of sulfuric acid diluted to 10% by mass and 2,000 mL of deionized water, about 2,000 mL of the processed solution was removed by using the ultrafiltration method, 2,000 mL of deionized water was added thereto, and about 2,000 mL of the solution was removed by using the ultrafiltration method. This operation was repeated three times.

Further, to the obtained processed solution was added 2,000 mL of deionized water, about 2,000 mL of the processed solution was removed by using the ultrafiltration method. This operation was repeated five times, to obtain 1.3% by mass of a blue-colored conductive polymer composite dispersion 10.

Preparation Example 11

4.16 g of 3,4-propylenedioxythiophene and a solution in which 8.2 g of Dopant polymer 1 has been dissolved in 1,000 mL of ultrapure water were mixed at 30° C.

The thus obtained mixed solution was maintained at 30° C., and under stirring, 8.40 g of sodium persulfate dissolved in 100 mL of ultrapure water and an oxidation catalyst solution of 2.3 g of ferric sulfate were gradually added thereto and stirred for 4 hours to react these materials.

To the obtained reaction mixture was added 1,000 mL of ultrapure water, and about 1,000 mL of the solution was removed by using the ultrafiltration method. This operation was repeated three times.

Then, to the processed solution to which the filtration treatment has been carried out were added 200 mL of sulfuric acid diluted to 10% by mass and 2,000 mL of deionized water, about 2,000 mL of the processed solution was removed by using the ultrafiltration method, 2,000 mL of deionized water was added thereto, and about 2,000 mL of the solution was removed by using the ultrafiltration method. This operation was repeated three times.

Further, to the obtained processed solution was added 2,000 mL of deionized water, about 2,000 mL of the processed solution was removed by using the ultrafiltration method. This operation was repeated five times, to obtain 1.3% by mass of a blue-colored conductive polymer composite dispersion 11.

Comparative Preparation Example 1

5.0 g of 3,4-ethylenedioxythiophene, and a solution in which 83.3 g of an aqueous polystyrenesulfonic acid solution (18.0% by mass, available from Aldrich) had been diluted by 250 mL of deionized water were mixed at 30° C. Preparation was carried out in the same manner as in Preparation Example 1 except for the above to obtain 1.3% by mass of blue-colored Comparative conductive polymer composite dispersion 1 (PEDOT-PSS dispersion). This Comparative conductive polymer composite dispersion 1 contains polystyrenesulfonic acid alone as a dopant polymer.

EXAMPLE

Each of 20 g of 1.3% by mass of the conductive polymer composite dispersions 1 to 11 obtained in Preparation Examples 1 to 11, 5 g of dimethylsulfoxide, and 0.5 g of Surfynol 465 serving also as a surfactant and antifoaming agent were mixed, respectively, thereafter, filtered using a regenerated cellulose filter (manufactured by ADVANTEC Corporation) having a pore size of 0.45 μm to prepare a conductive polymer composition, which was designated as Examples 1 to 11, respectively.

Comparative Example

A conductive polymer composition was prepared in the same manner as in Examples except for using Comparative conductive polymer composite dispersion 1 obtained in Comparative Preparation Example 1, to make it Comparative Example 1.

The conductive polymer compositions of Examples and Comparative Example thus prepared were evaluated as follows.

(Filterability)

In the preparation of conductive polymer compositions of Examples and Comparative Example, when filtration was carried out using a regenerated cellulose filter having a pore diameter of 0.45 μm, that which could be filtered was evaluated as "○", and that which could not be filtered since the filter was clogged was evaluated as "x" and shown in Table 1.

(Coatability)

First, the conductive polymer composition was spin-coated onto a Si wafer by using 1H-360S SPINCOATER (manufactured by MIKASA) so that the film thickness became 100±5 nm. Next, baking was carried out in a precise constant temperature oven at 120° C. for 5 minutes, and the solvent was removed to obtain a conductive film. For this conductive film, the refractive index (n, k) at a wavelength of 636 nm was obtained by a spectroscopic ellipsometer VASE (manufactured by J.A. Woollam Co.) with variable incident angle. A sample in which a uniform film could be formed was evaluated as "○", while those in which a refractive index could be measured but defects derived from particles or partial striation occurred in the film were evaluated as "X" and shown in Table 1.

(Transmittance)

From the refractive index (k) measured by a spectroscopic ellipsometer (VASE) with variable incident angle, the transmittance for light with a wavelength of 550 nm at FT=200 nm was calculated. The results are shown in Table 1.

(Conductivity)

First, 1.0 mL of the conductive polymer composition was dropped onto a SiO$_2$ wafer having a diameter of 4 inches (100 mm), and then, after 10 seconds, it was spin-coated on the whole wafer by using a spinner. The spin coating conditions were so adjusted that the film thickness became 100±5 nm. Baking was carried out in a precise constant temperature oven at 120° C. for 5 minutes, and the solvent was removed to obtain a conductive film.

The conductivity (S/cm) of the obtained conductive film was obtained from the surface resistivity (Ω/D) measured by using Hiresta-UP MCP-HT450 and Loresta-GP MCP-T610 (both manufactured by Mitsubishi Chemical Corporation) and the actually measured value of the film thickness. The results are shown in Table 1.

(Surface Roughness)

In the same manner as the evaluation method of the conductivity, a conductive film was obtained on a SiO$_2$ wafer having a diameter of 4 inches (100 mm). RMS (root mean square roughness) was measured with AFM NANO-IM-8 (manufactured by Image Metrology). The results are shown in Table 1.

(Flexibility)

The operation of bending a flexible glass onto which a conductive polymer composition had been coated at an angle of 90° and then returning it horizontally was repeated ten times, and it was observed with naked eyes whether or not the conductive film was cracked, and that having no crack was evaluated as good. The results are shown in Table 1.

(Viscosity)

The content of the solid components of a conductive polymer composition was made 1.3% by mass, and it was so adjusted that the liquid temperature became 25° C. 35 mL thereof was weighed into a measurement cell specifically attached to a tuning fork type vibration type viscometer SV-10 (manufactured by A&D Company Limited), and the viscosity immediately after preparation was measured. The results are shown in Table 1.

[Evaluation of Conductive Polymer Composition]

TABLE 1

| | Filterability | Coatability | Flexibility | Surface roughness (RMS, nm) | Transmittance (%) at film thickness of 200 nm and wavelength of 550 nm | Conductivity (S/cm) | Viscosity (mPa · s) |
|---|---|---|---|---|---|---|---|
| Example 1 | ○ | ○ | Good | 0.14 | 94 | 320 | 15.0 |
| Example 2 | ○ | ○ | Good | 0.17 | 95 | 480 | 25.0 |
| Example 3 | ○ | ○ | Good | 0.11 | 96 | 110 | 18.3 |
| Example 4 | ○ | ○ | Good | 0.12 | 96 | 210 | 22.3 |
| Example 5 | ○ | ○ | Good | 0.14 | 92 | 180 | 16.5 |
| Example 6 | ○ | ○ | Good | 0.10 | 94 | 110 | 25.8 |
| Example 7 | ○ | ○ | Good | 0.12 | 95 | 120 | 26.3 |
| Example 8 | ○ | ○ | Good | 0.11 | 95 | 135 | 23.5 |
| Example 9 | ○ | ○ | Good | 0.12 | 96 | 280 | 22.3 |
| Example 10 | ○ | ○ | Good | 0.13 | 95 | 260 | 18.8 |
| Example 11 | ○ | ○ | Good | 0.13 | 95 | 210 | 26.7 |
| Comparative Example 1 | X | X | Good | 0.28 | 85 | 460 | 65.0 |

As shown in Table 1, in Examples 1 to 11 containing a polythiophene as the π-conjugated polymer, and containing a dopant polymer having the repeating unit "a", filterability was good, and a uniform coating film could be obtained by coating with a spin coater. In addition, it had high conductivity, transmittance for visible light with λ=550 nm thereof was good, and surface roughness thereof was also good.

On the other hand, in Comparative Example 1 in which polystyrenesulfonic acid having no repeating unit "a" is used as a dopant polymer, filterability was poor due to its high viscosity, and as a result, particles and striation caused by bubbles occurred on the film in spin coating, whereby a uniform coating film could not be obtained. Also, whereas the conductivity was high, transmittance for visible light with λ=550 nm, and surface roughness were inferior to those of Examples 1 to 11.

According to the conductive polymer composite of the present invention, it was clarified that it was low viscosity and had good filterability and good film formability by spin coating, and when a film was formed, a conductive film and a hole injection layer having good transparency, flatness, durability, and conductivity could be formed.

It is to be noted that it must be stated here that the present invention is not restricted to the embodiments shown by Examples. The embodiments shown by Examples are merely examples so that any embodiments composed of substantially the same technical concept as disclosed in the claims of the present invention and expressing a similar effect are included in the technical scope of the present invention.

What is claimed is:

1. A conductive polymer composite which comprises a conductive polymer composite comprising (A) a π-conjugated polymer, and (B) a dopant polymer containing a repeating unit represented by the following general formula (1) and having a weight average molecular weight in the range of 1,000 to 500,000,

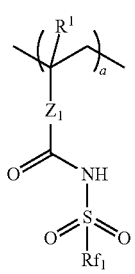
(1)

wherein, $R^1$ represents a hydrogen atom or a methyl group; $Rf_1$ represents a linear or branched alkyl group having 1 to 4 carbon atoms or a phenyl group, and has at least one of a fluorine atom or a trifluoromethyl group in $Rf_1$; $Z_1$ represents a single bond, an arylene group having 6 to 12 carbon atoms or —C(=O)—O—$R^2$—; $R^2$ represents a linear, branched or cyclic alkylene group having 1 to 12 carbon atoms, an arylene group having 6 to 10 carbon atoms or an alkenylene group having 2 to 10 carbon atoms, and may have an ether group, a carbonyl group or an ester group in $R^2$; and "a" is $0<a\le1.0$.

2. The conductive polymer composite according to claim 1, wherein the repeating unit represented by the general formula (1) in Component (B) contains one or more kinds of repeating units selected from repeating units represented by the following general formula (1-1):

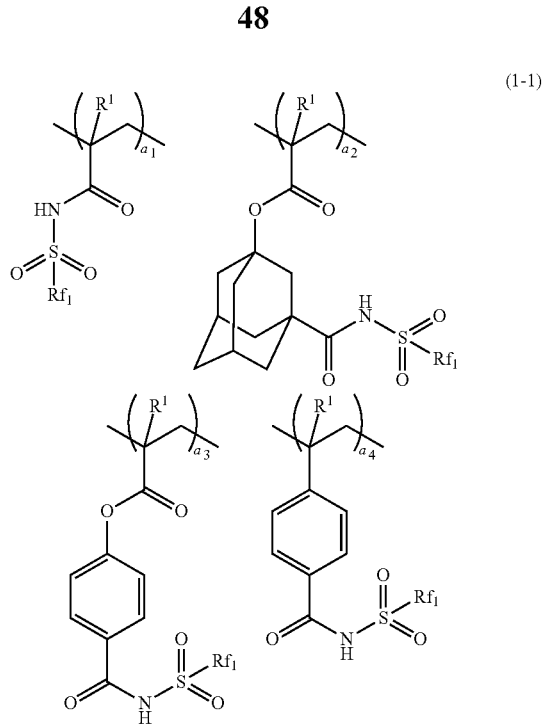
(1-1)

wherein, $R^1$ and $Rf_1$ have the same meanings as defined above; and "$a_1$", "$a_2$", "$a_3$", and "$a_4$" are $0\le a_1\le1.0$, $0\le a_2\le1.0$, $0\le a_3\le1.0$, $0\le a_4\le1.0$, and $0<a_1+a_2+a_3+a_4\le1.0$.

3. The conductive polymer composite according to claim 1, wherein

Component (B) further contains a repeating unit represented by the following general formula (2):

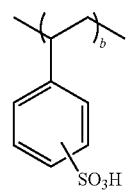
(2)

wherein, "b" is $0<b<1.0$.

4. The conductive polymer composite according to claim 2, wherein

Component (B) further contains a repeating unit represented by the following general formula (2):

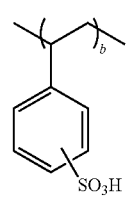
(2)

wherein, "b" is $0<b<1.0$.

5. The conductive polymer composite according to claim 1, wherein Component (B) is a block copolymer.

6. The conductive polymer composite according to claim 2, wherein Component (B) is a block copolymer.

7. The conductive polymer composite according to claim 3, wherein Component (B) is a block copolymer.

8. The conductive polymer composite according to claim 4, wherein Component (B) is a block copolymer.

9. The conductive polymer composite according to claim 1, wherein Component (A) is a material in which one or more kinds of precursor monomers selected from the group consisting of pyrrole, thiophene, selenophene, tellorophene, aniline, a polycyclic aromatic compound, and a derivative thereof is/are polymerized.

10. The conductive polymer composite according to claim 2, wherein Component (A) is a material in which one or more kinds of precursor monomers selected from the group consisting of pyrrole, thiophene, selenophene, tellorophene, aniline, a polycyclic aromatic compound, and a derivative thereof is/are polymerized.

11. The conductive polymer composite according to claim 3, wherein Component (A) is a material in which one or more kinds of precursor monomers selected from the group consisting of pyrrole, thiophene, selenophene, tellorophene, aniline, a polycyclic aromatic compound, and a derivative thereof is/are polymerized.

12. The conductive polymer composite according to claim 4, wherein Component (A) is a material in which one or more kinds of precursor monomers selected from the group consisting of pyrrole, thiophene, selenophene, tellorophene, aniline, a polycyclic aromatic compound, and a derivative thereof is/are polymerized.

13. The conductive polymer composite according to claim 1, wherein the conductive polymer composite has dispersibility in water or an organic solvent.

14. The conductive polymer composite according to claim 2, wherein the conductive polymer composite has dispersibility in water or an organic solvent.

15. The conductive polymer composite according to claim 3, wherein the conductive polymer composite has dispersibility in water or an organic solvent.

16. The conductive polymer composite according to claim 4, wherein the conductive polymer composite has dispersibility in water or an organic solvent.

17. A substrate onto which a conductive film has been formed by the conductive polymer composite according to claim 1.

18. A substrate onto which a conductive film has been formed by the conductive polymer composite according to claim 2.

19. The substrate according to claim 17, wherein the conductive film is a material which acts as a transparent electrode layer.

20. The substrate according to claim 18, wherein the conductive film is a material which acts as a transparent electrode layer.

* * * * *